(12) United States Patent
Yang et al.

(10) Patent No.: US 8,624,359 B2
(45) Date of Patent: Jan. 7, 2014

(54) WAFER LEVEL CHIP SCALE PACKAGE AND METHOD OF MANUFACTURING THE SAME

(75) Inventors: Chung-Ying Yang, Taoyuan (TW); Hsien-Wei Chen, Sinying (TW); Tsung-Yuan Yu, Taipei (TW); Shih-Wei Liang, Dajia Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/253,845

(22) Filed: Oct. 5, 2011

(65) Prior Publication Data

US 2013/0087914 A1    Apr. 11, 2013

(51) Int. Cl.
*H01L 23/544*    (2006.01)

(52) U.S. Cl.
USPC ........... 257/620; 257/508; 257/738; 257/773; 257/E23.021; 438/115

(58) Field of Classification Search
USPC .................. 257/508, 620, 738, 773, E23.021; 438/115
See application file for complete search history.

(56) References Cited

U.S. PATENT DOCUMENTS

| | | | | |
|---|---|---|---|---|
| 7,968,378 B2* | 6/2011 | Mahler et al. | ................. | 438/113 |
| 8,125,072 B2* | 2/2012 | Lachner et al. | ............... | 257/693 |
| 2008/0191205 A1* | 8/2008 | Tsai et al. | ........................ | 257/48 |
| 2011/0254136 A1* | 10/2011 | Tsutsue et al. | ................ | 257/620 |
| 2011/0306197 A1* | 12/2011 | Kim et al. | ........................ | 438/593 |
| 2012/0168943 A1* | 7/2012 | Gan et al. | ........................ | 257/738 |
| 2012/0205753 A1* | 8/2012 | Adams et al. | ................. | 257/415 |

* cited by examiner

*Primary Examiner* — William F Kraig
*Assistant Examiner* — Gardner W Swan
(74) *Attorney, Agent, or Firm* — Lowe Hauptman & Ham, LLP

(57) ABSTRACT

A wafer level chip scale package (WLCSP) includes a semiconductor device including an active surface having a contact pad, and side surfaces. A mold covers the side surfaces of the semiconductor device. A RDL structure includes a first PPI line electrically connected to the contact pad and extending on the active surface of the semiconductor device. A UBM layer is formed over and electrically connected to the first PPI line. A seal ring structure extends around the upper periphery of the semiconductor device on the mold. The seal ring structure includes a seal layer extending on the same level as at least one of the first PPI line and the UBM layer. A method of manufacturing a WLCSP includes forming a re-routing laminated structure by simultaneously forming an interconnection line and a seal layer on the molded semiconductor devices.

22 Claims, 28 Drawing Sheets

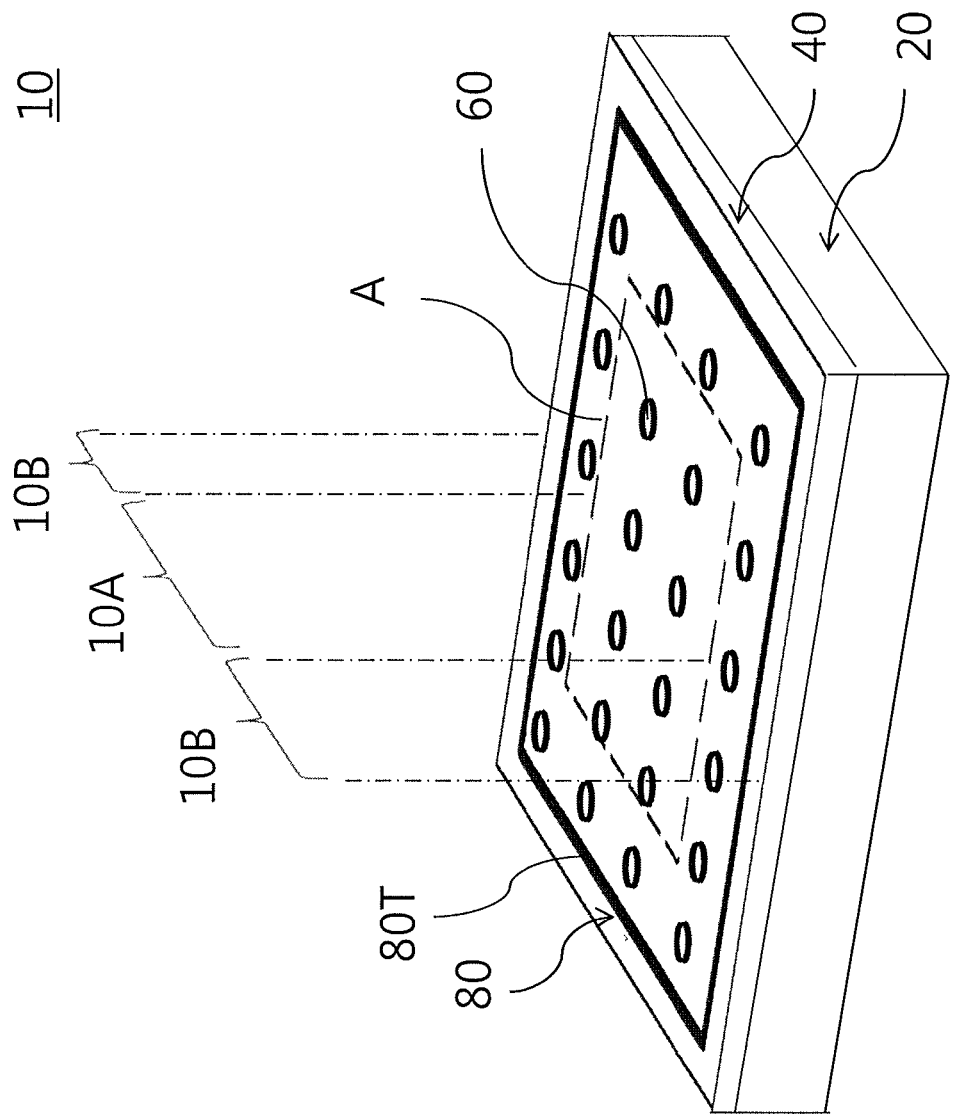

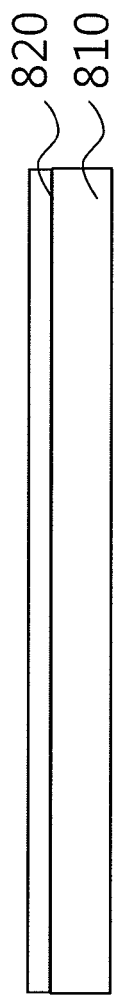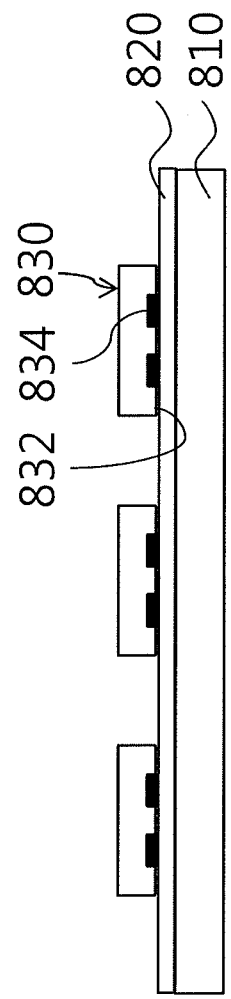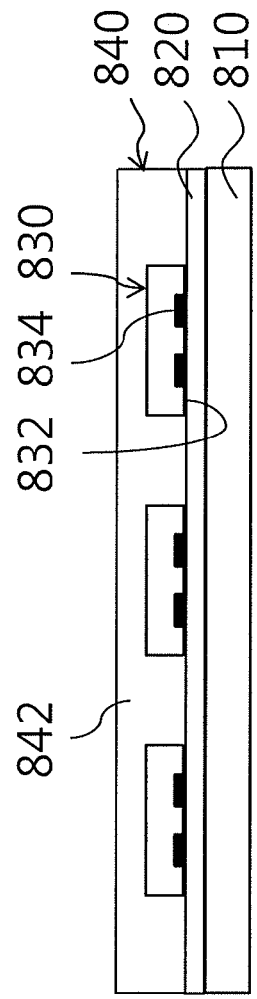

WAFER LEVEL CHIP SCALE PACKAGE AND METHOD OF MANUFACTURING THE SAME

TECHNICAL FIELD

The disclosure relates to packages for semiconductors and methods of manufacturing the packages, and more particularly to wafer level chip scale packages (WLCSPs) and methods of manufacturing the same.

BACKGROUND

A WLCSP structure is used as one of the package structures for semiconductor components of electronic products. Increased number of input-output (I/O) electrical contacts combined with increased demands for high performance integrated circuits (ICs) has led to the development of fan-out type WLCSP structures enabling larger pitches of bumps for the I/O electrical contacts.

DESCRIPTION OF THE DRAWINGS

FIG. 1A is a perspective view of a wafer level chip scale package (WLCSP) according to an embodiment;

FIGS. 8A-8G are cross-sectional views for a method of manufacturing a WLCSP according to still another embodiment;

DETAILED DESCRIPTION

Figure 1B:
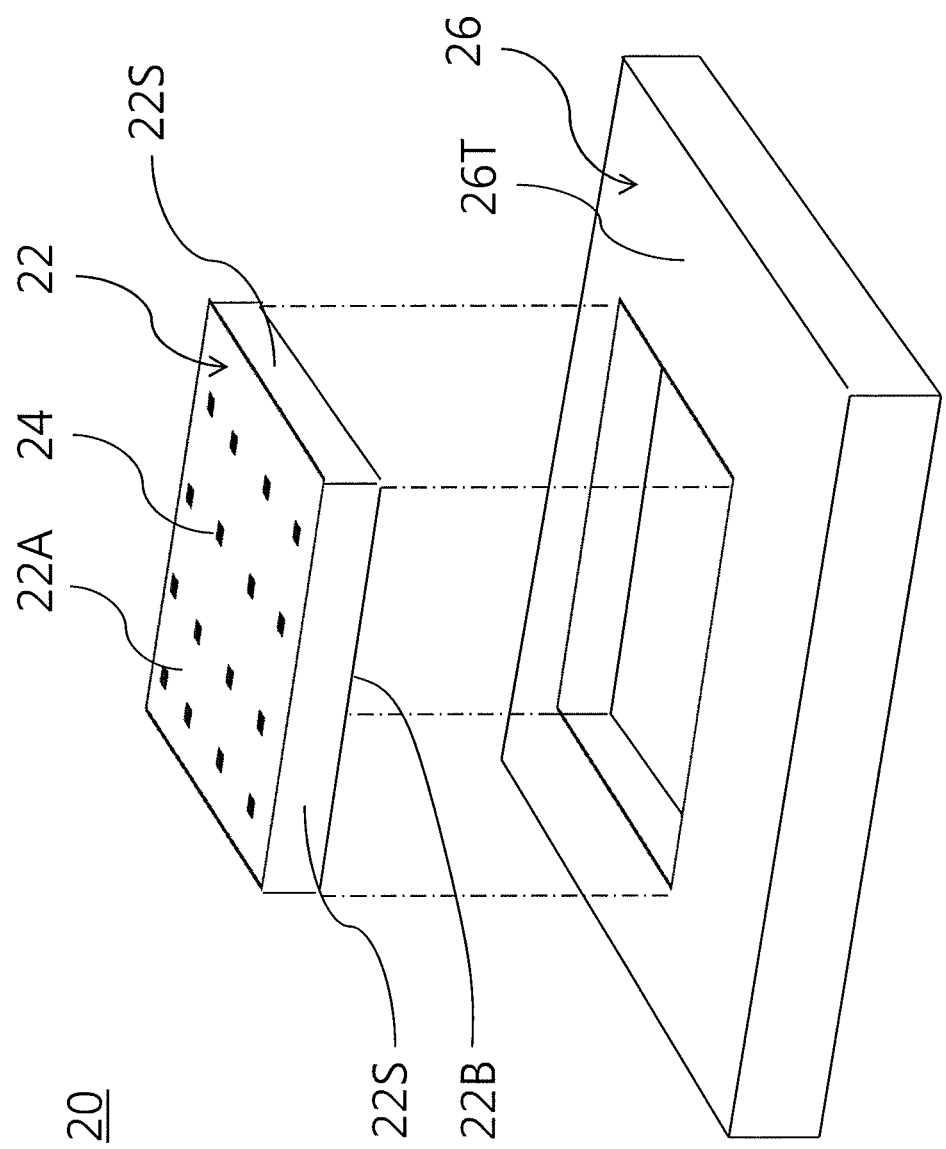
FIG. 1B is an exploded perspective view of a molded semiconductor device included in the WLCSP of FIG. 1A.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIG. 1A is a perspective view of a fan-out type wafer level chip scale package (WLCSP) 10 according to an embodiment. FIG. 1B is an exploded perspective view of a molded semiconductor device 20 included in the WLCSP 10.

The WLCSP 10 has a chip area 10A defined by a broken line A, and a fan-out area 10B surrounding the chip area 10A. The WLCSP 10 comprises the molded semiconductor device 20, a re-routing laminated structure 40, a plurality of solder balls 60, and a seal ring structure 80. The molded semiconductor device 20 includes a semiconductor device 22 positioned in the chip area 10A, and a mold 26 surrounding the semiconductor device 22 in the fan-out area 10B. The semiconductor device 22 includes an active surface 22A having a plurality of contact pads 24, side surfaces 22S, and a bottom surface 22B. The mold 26 covers the side surfaces 22S and the bottom surface 22B of the semiconductor device 22. The mold 26 has a top surface 26T extending around the active surface 22A of the semiconductor device 22.

In one or more embodiments, the semiconductor device 22 comprises a substrate and integrated circuits formed in and/or on the substrate. The contact pads 24 are contact regions for connecting the integrated circuits in the semiconductor device 22 to external features. In some embodiments, the substrate comprises a bulk silicon wafer, a silicon-on-insulator (SOI) substrate, or a silicon germanium substrate. In some embodiments, the integrated circuits comprise electronic circuits such as transistors, diodes, resistors, capacitors, inductors, active devices, or passive devices. In one or more embodiments, the semiconductor device 22 includes multiple metallization structures overlying the integrated circuits, and inter-layer dielectric layers for insulating the electronic circuits and the multiple metallization structures. In one or more embodiments, the active surface 22A comprises a passivation layer exposed to the outside of the semiconductor device 22. The contact pads 24 are exposed to the outside of the semiconductor device 22 through openings formed in the passivation layer. In one or more embodiments, the contact pads 24 include at least one of Cu or Al, but are not limited by the above-mentioned materials. In some embodiments, the passivation layer is formed of undoped silicate glass (USG), silicon nitride, silicon oxynitride, silicon oxide, or combinations thereof, but is not limited by the above-mentioned materials. In some embodiments, the mold 26 is formed from at least one molding material selected from an epoxy-based resin, a silicon-based based resin, Novolac-based resin, or other suitable encapsulants.

The re-routing laminated structure 40 is formed on the molded semiconductor device 20. The re-routing laminated structure 40 has a plurality of redistribution layer (RDL) structures. In some embodiments, the re-routing laminated structure 40 comprises at least one of re-routing laminated structures 40A, 40B, 40C, 40D, and 40E, shown in FIGS. 2-6. In some embodiments, the plurality of RDL structures in the re-routing laminated structure 40 includes at least one of RDL structures 130 and 230 shown in FIGS. 2-6. The RDL structures connect the contact pads 24 of the semiconductor device 22 to the solder balls 60 in order to redistribute the contact pads 24, thereby laterally disposing at least one of the solder balls 60 from the chip area 10A toward the fan-out area 10B. In one or more embodiments, some of the RDL structures extend within the chip area 10A over the molded semiconductor device 20. In some embodiments, some of the RDL structures extend from the chip area 10A to the fan-out area 10B over the molded semiconductor device 20. The solder balls 60 are arranged on and electrically connected to the RDL structures. Details about the RDL structures will be described later with reference to FIGS. 2-6. In some embodiments, the solder balls 60 comprise Cu, or Cu alloys, but are not limited by the above-mentioned materials.

The fan-out area 10B of the WLCSP 10 enables larger solder ball pitches, thereby resulting in a greater flexibility in terms of the arrangement of the solder balls 60.

The semiconductor device 22 is obtained by a series of processes including a process of simultaneously fabricating a plurality of integrated circuits on a wafer, a process of sawing the wafer into individual chips constituting the semiconductor device 22. The active surface 22A of the semiconductor device 22 is protected by a passivation layer formed during the process of fabricating the plurality of integrated circuits on the wafer. However, the side surfaces 22S of the semiconductor device 22 are not covered by the passivation layer. Therefore, the side surfaces 22S of the semiconductor device 22 may be vulnerable to undesirable moisture and mobile ionic contaminants. For example, moisture penetrated into the interior of the semiconductor device 22 can be trapped in oxide dielectric layers, and thus increase the dielectric constant of the dielectric layers, or increase possibility of crack propagation or delamination caused by the reduction of the mechanical strength of the dielectric layers. Additionally, moisture penetrated into the interior of the semiconductor device 22 can degrade the performance of unit devices such as transistors formed within the semiconductor device 22, or can cause corrosion or short circuit, thereby reducing reliability of the semiconductor device 22 or causing device failure. The mobile ionic contaminants within the semiconductor device 22 can cause threshold voltage instability in complementary metal oxide semiconductor (CMOS) transistors, or change the surface potential of a silicon surface in the vicinity of the ionic contaminants.

In order to protect the semiconductor device 22 and the RDL structures, the seal ring structure 80 is formed within and on the re-routing laminated structure 40. The seal ring structure 80 has a top surface 80T exposed to the outside of the re-routing laminated structure 40. The seal ring structure 80 extends around the upper periphery of the semiconductor device 22 over the molded semiconductor device 20. In some embodiments, the seal ring structure 80 extends within the fan-out area 10B over the mold 26. In some embodiments, the seal ring structure 80 extends from the fan-out area 10B to edge portions of the chip area 10A within the re-routing laminated structure 40. In one or more embodiments, the seal ring structure 80 is formed of at least one of metals or metal alloys. The seal ring structure 80 can stop undesirable moisture and mobile ionic contaminants from penetrating through the re-routing laminated structure 40 and through the side surfaces 22S of the semiconductor device 22 into a functional circuit area of the semiconductor device 22, and can enable structural reinforcement of the WLCSP 10, thereby preventing operational reliability of the semiconductor device 22 from being degraded.

In FIG. 1A, the seal ring structure 80 is illustrated to have a rectangular or square shape and to extend in a continuously extended line shape. However, the configuration of the seal ring structure 80 is not limited thereto. In one or more embodiments, the seal ring structure 80 has at least one slit portion (not shown) for cutting the seal ring structure 80 in order to prevent current from being induced in the seal ring structure 80. In some embodiments, the seal ring structure 80 extends in a shape of intermittent line elongated around the upper periphery of the semiconductor device 22 along edges and corners of the chip area 10A within and on the re-routing laminated structure 40. In some embodiments, the seal ring structure 80 extends in a shape of curved or rounded line within and on the re-routing laminated structure 40.

FIGS. 2-6 are cross-sectional views of WLCSPs 100, 200, 300, 400, and 500 according to various embodiments of the present disclosure. In some embodiments, at least one of the WLCSPs 100, 200, 300, 400, or 500 is included in the WLCSP 10 depicted in FIG. 1A. In FIGS. 2-6, the same or similar features are identified by the same reference numerals. The features are the same as or similar to like-numbered features described with respect to FIGS. 1A and 1B. Therefore, the descriptions will be omitted to avoid repetition.

Figure 2:
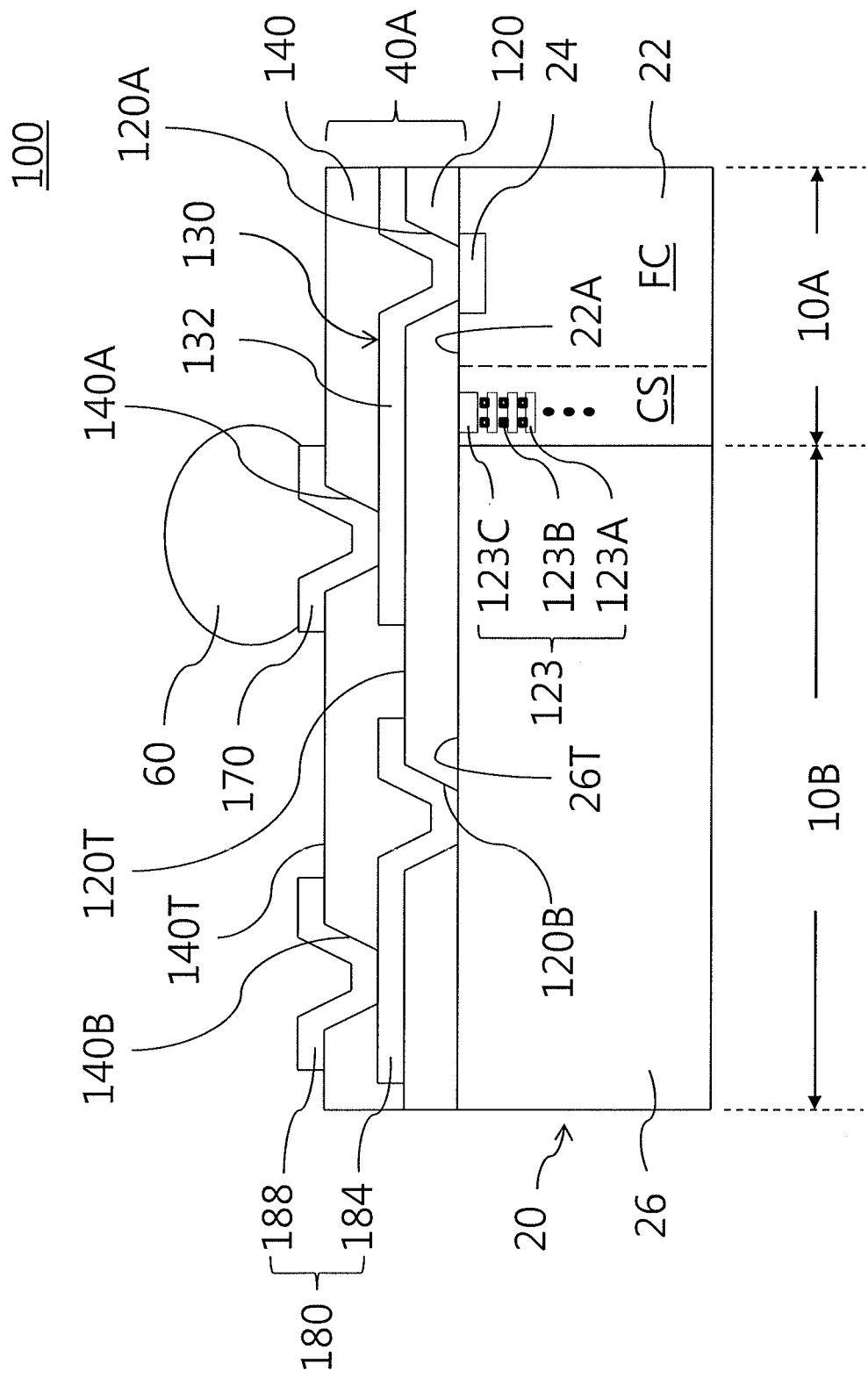
FIG. 2 is a cross-sectional view of a WLCSP according to another embodiment.

Referring to FIG. 2, the WLCSP 100 comprises the molded semiconductor device 20 having the semiconductor device 22 and the mold 26. The semiconductor device 22 includes a functional circuit area FC and a chip seal area CS. The functional circuit area FC includes active semiconductor devices and interconnections. The chip seal area CS is formed to surround the functional circuit area FC. At least one chip seal ring 123 is formed in the chip seal area CS. The chip seal ring 123 includes a stack structure having a plurality of metallic layers 123A. The metallic layers 123A are connected to one another by a plurality of via contacts 123B interposed between each of the metallic layers 123A. The chip seal ring 123 further includes a seal contact pad 123C. The seal contact pad 123C is a top layer of the chip seal ring 123. The seal contact pad 123C is connected to the metallic layers 123A. In some embodiments, the chip seal ring 123 has a closed loop structure surrounding the functional circuit area FC. The chip seal ring 123 protects the functional circuit area FC by preventing undesirable moisture or chemical contaminants from penetrating into the functional circuit area FC. Additionally, the chip seal ring 123 protects the functional circuit area FC against damage by stress or mechanical attack from outside.

The re-routing laminated structure 40A has the RDL structure 130. The RDL structure 130 includes a post-passivation interconnection (PPI) line 132 electrically connected to the contact pad 24, and extending from the chip area 10A to the fan-out area 10B on the molded semiconductor device 20.

An under-bump metallurgy (UBM) layer 170 is formed on and electrically connected to the PPI line 132. The solder ball 60 is formed on and electrically connected to the UBM layer 170. The solder ball 60 overlies the mold 26. In some embodiments, the solder ball 60 overlies the semiconductor device 22.

A seal ring structure 180 is formed within the re-routing laminated structure 40A on the mold 26. In some embodiments, the seal ring structure 180 extends around the upper periphery of the semiconductor device 22. The seal ring structure 180 includes a lower seal layer 184 and a top seal layer 188. The lower seal layer 184 extends on the same level as the PPI line 132 and is spaced apart from the PPI line 132. The lower seal layer 184 and the PPI line 132 comprise the same material. In some embodiments, the lower seal layer 184 and the PPI line 132 comprise metal or metal alloy. For example, the lower seal layer 184 and the PPI line 132 comprise at least one of Cu, Al, Ag, Au, or Ni, but are not limited by the above-mentioned materials. The top seal layer 188 extends on the same level as the UBM layer 170 and is spaced apart from the UBM layer 170. The top seal layer 188 is exposed to the outside of the re-routing laminated structure 40A. The top seal layer 188 and the UBM layer 170 comprise the same material. In some embodiments, the top seal layer 188 and the UBM layer 170 comprise metal or metal alloy. For example, the top seal layer 188 and the UBM layer 170 comprise at least one of Cu, Al, Ag, Au, or Ni, but are not limited by the above-mentioned materials.

The lower seal layer 184 and the PPI line 132 are formed on a first insulation layer 120. The first insulation layer 120 has a first via opening 120A exposing the contact pad 24 of the semiconductor device 22, and a second via opening 120B exposing a portion of the top surface 26T of the mold 26. The lower seal layer 184 extends along a top surface 120T of the first insulation layer 20 and along inner walls of the second via opening 120B so that the lower seal layer 184 is in contact with the top surface 26T of the mold 26 within the second via opening 120B.

A second insulation layer 140 covers the lower seal layer 184 and the PPI line 132 on the first insulation layer 120. The second insulation layer 140 has a first via opening 140A exposing the PPI line 132, and a second via opening 140B exposing the lower seal layer 184. The top seal layer 188 extends along a top surface 140T of the second insulation layer 140 and along inner walls of the second via opening 140B so that the top seal layer 188 is in contact with the lower seal layer 184.

In some embodiments, the first insulation layer 120 and the second insulation layer 140 comprise at least one polymer selected from polybenzoxazole (PBO), benzocyclobutene (BCB), polyimide (PI), or epoxy, but are not limited by the above-mentioned materials.

In the WLCSP 100, the seal ring structure 180 has a bi-level structure having the lower seal layer 184 and the top seal layer 188. The seal ring structure 180 protects the semiconductor device 22 by preventing undesirable moisture or mobile ionic contaminants from penetrating into the semiconductor device 22 through the interfaces between the mold 26, the first insulation layer 120, and the second insulation layer 140.

Figure 3:
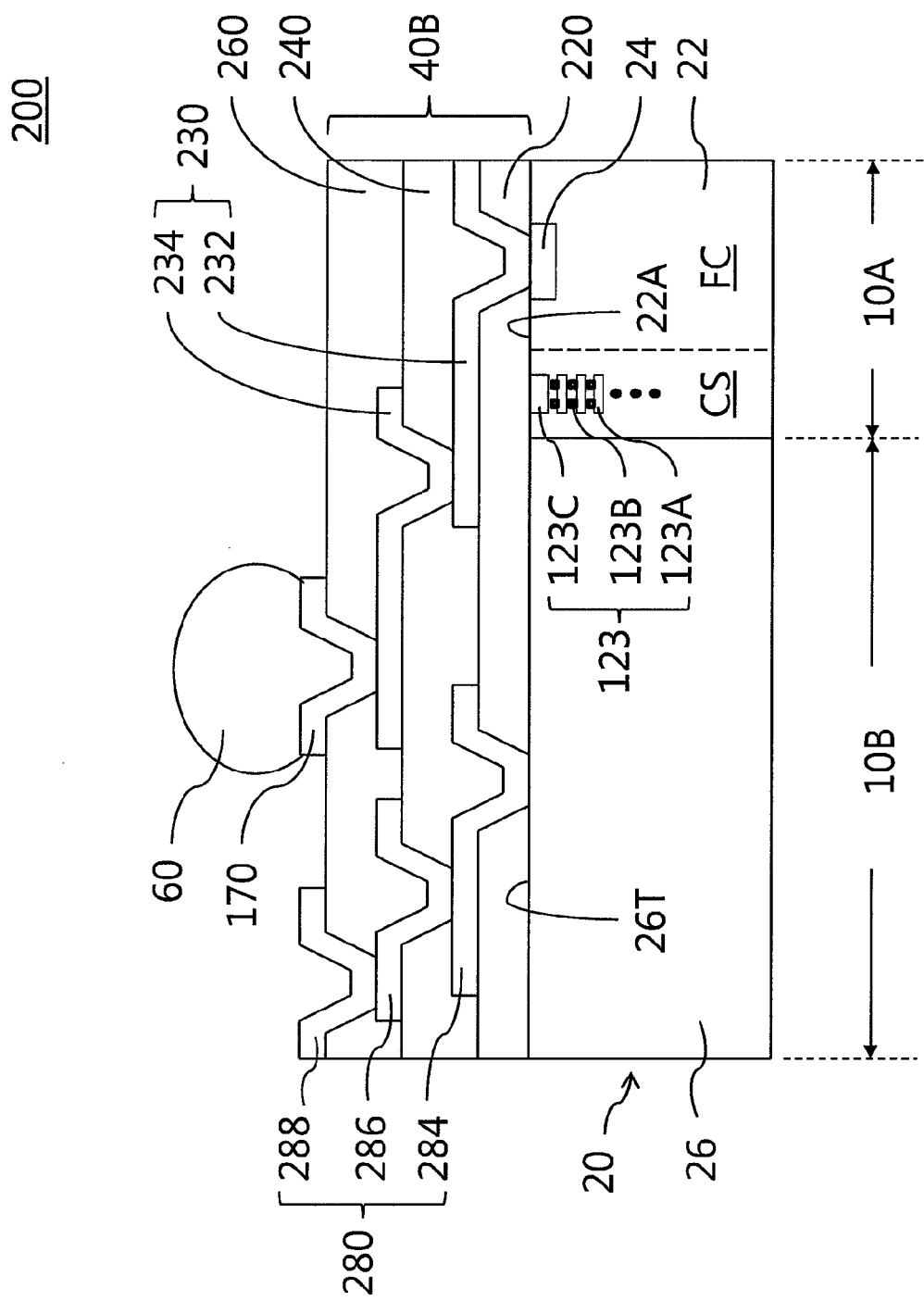
FIG. 3 is a cross-sectional view of a WLCSP according to still another embodiment.

Referring to FIG. 3, the WLCSP 200 comprises the re-routing laminated structure 40B having the RDL structure 230. The RDL structure 230 includes a first PPI line 232 electrically connected to the contact pad 24, and a second PPI line 234 formed on and electrically connected to the first PPI line 232. The first PPI line 232 and the second PPI line 234 extend on the semiconductor device 22 and on the mold 26. The UBM layer 170 is formed on and electrically connected to the second PPI line 234.

The seal ring structure 280 is formed within the re-routing laminated structure 40B on the mold 26. The seal ring structure 280 includes a first lower seal layer 284, a second lower seal layer 286, and a top seal layer 288. The first lower seal layer 284 is in contact with a portion of the top surface 26T of the mold 26. The second lower seal layer 286 is connected to the first lower seal layer 284 and the top seal layer 288 therebetween.

The first lower seal layer 284 extends on the same level as the first PPI line 232 and is spaced apart from the first PPI line 232. The first lower seal layer 284 and the first PPI line 232 comprise the same material. In some embodiments, the first lower seal layer 284 and the first PPI line 232 comprise metal or metal alloy. For example, the first lower seal layer 284 and the first PPI line 232 comprise at least one of Cu, Al, Ag, Au, or Ni, but are not limited by the above-mentioned materials.

The second lower seal layer 286 extends on the same level as the second PPI line 234 and is spaced apart from the second PPI line 234. The second lower seal layer 286 and the second PPI line 234 comprise the same material. In some embodiments, the second lower seal layer 286 and the second PPI line 234 comprise metal or metal alloy. For example, the second lower seal layer 286 and the second PPI line 234 comprise at least one of Cu, Al, Ag, Au, or Ni, but are not limited by the above-mentioned materials.

The top seal layer 288 extends on the same level as the UBM layer 170 and is spaced apart from the UBM layer 170. The top seal layer 288 is exposed to the outside of the re-routing laminated structure 40B. The top seal layer 288 and the UBM layer 170 comprise the same material. In some embodiments, the top seal layer 288 and the UBM layer 170 comprise metal or metal alloy. For example, the top seal layer 288 and the UBM layer 170 comprise at least one of Cu, Ti, or Ni, but are not limited by the above-mentioned materials.

The first lower seal layer 284 and the first PPI line 232 are formed on a first insulation layer 220. A second insulation layer 240 covers the first lower seal layer 284 and the first PPI line 232 on the first insulation layer 220. A third insulation layer 260 covers the second lower seal layer 286 and the second PPI line 234 on the second insulation layer 240.

In the WLCSP 200, the seal ring structure 280 includes a tri-level structure having the first lower seal layer 284, the second lower seal layer 286, and the top seal layer 288. The seal ring structure 280 protects the semiconductor device 22 by preventing undesirable moisture or mobile ionic contaminants from penetrating into the semiconductor device 22 through the interfaces between the mold 26, the first insulation layer 220, the second insulation layer 240, and the third insulation layer 260.

Figure 4:
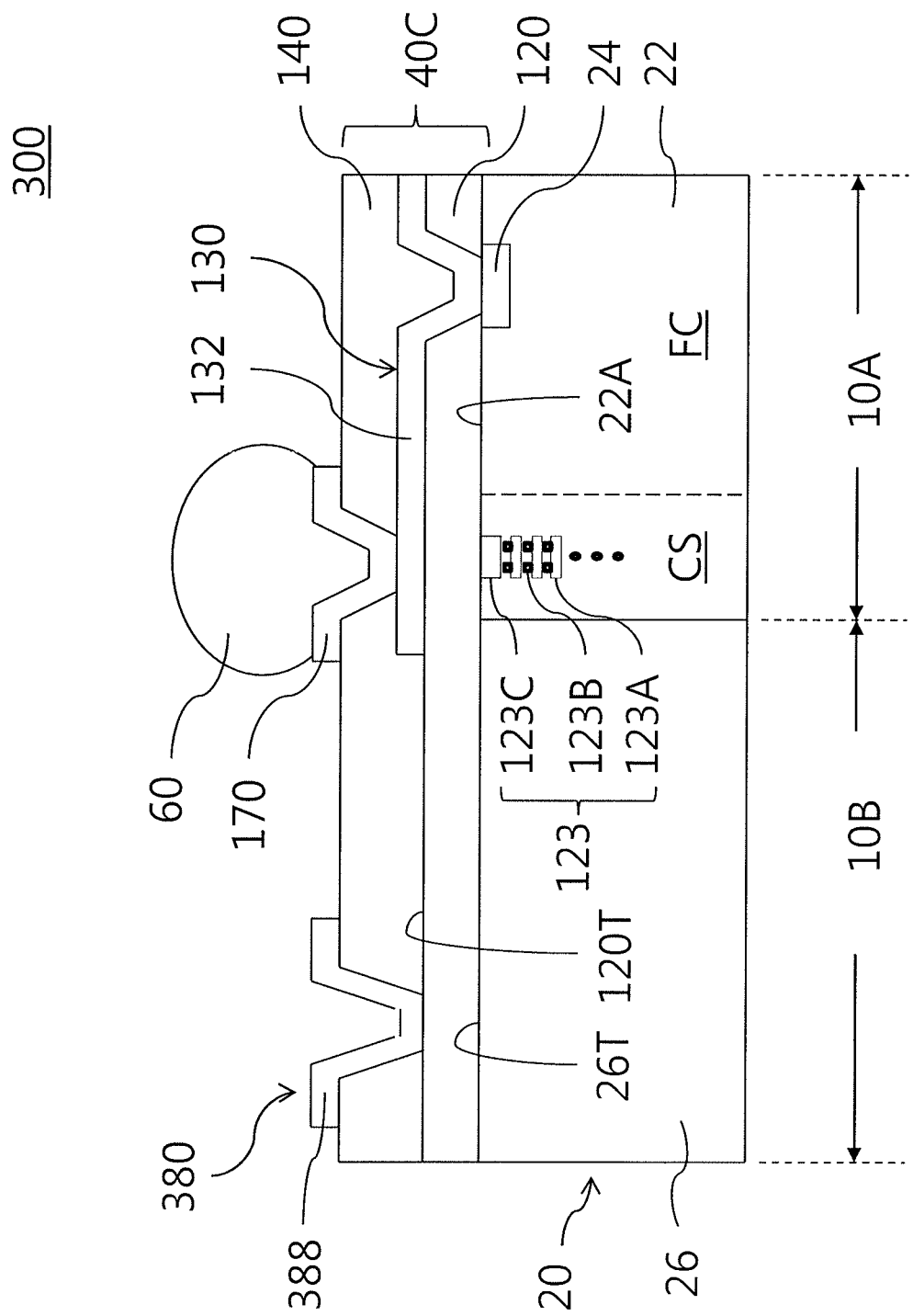
FIG. 4 is a cross-sectional view of a WLCSP according to still another embodiment.

Referring to FIG. 4, the WLCSP 300 has the same structure as the WLCSP 100 depicted in FIG. 2 except that the WLCSP 300 comprises a seal ring structure 380 including a top seal layer 388 being in contact with the top surface 120T of the first insulation layer 120. The seal ring structure 380 is spaced apart from the mold 26. The top seal layer 388 extends on the same level as the UBM layer 170 and is spaced apart from the UBM layer 170.

In the WLCSP 300, the seal ring structure 380 has a single-level structure of the top seal layer 388. The seal ring structure 380 protects the semiconductor device 22 by preventing undesirable moisture or mobile ionic contaminants from penetrating into the semiconductor device 22 through the interface between the first insulation layer 120 and the second insulation layer 140.

Figure 5:
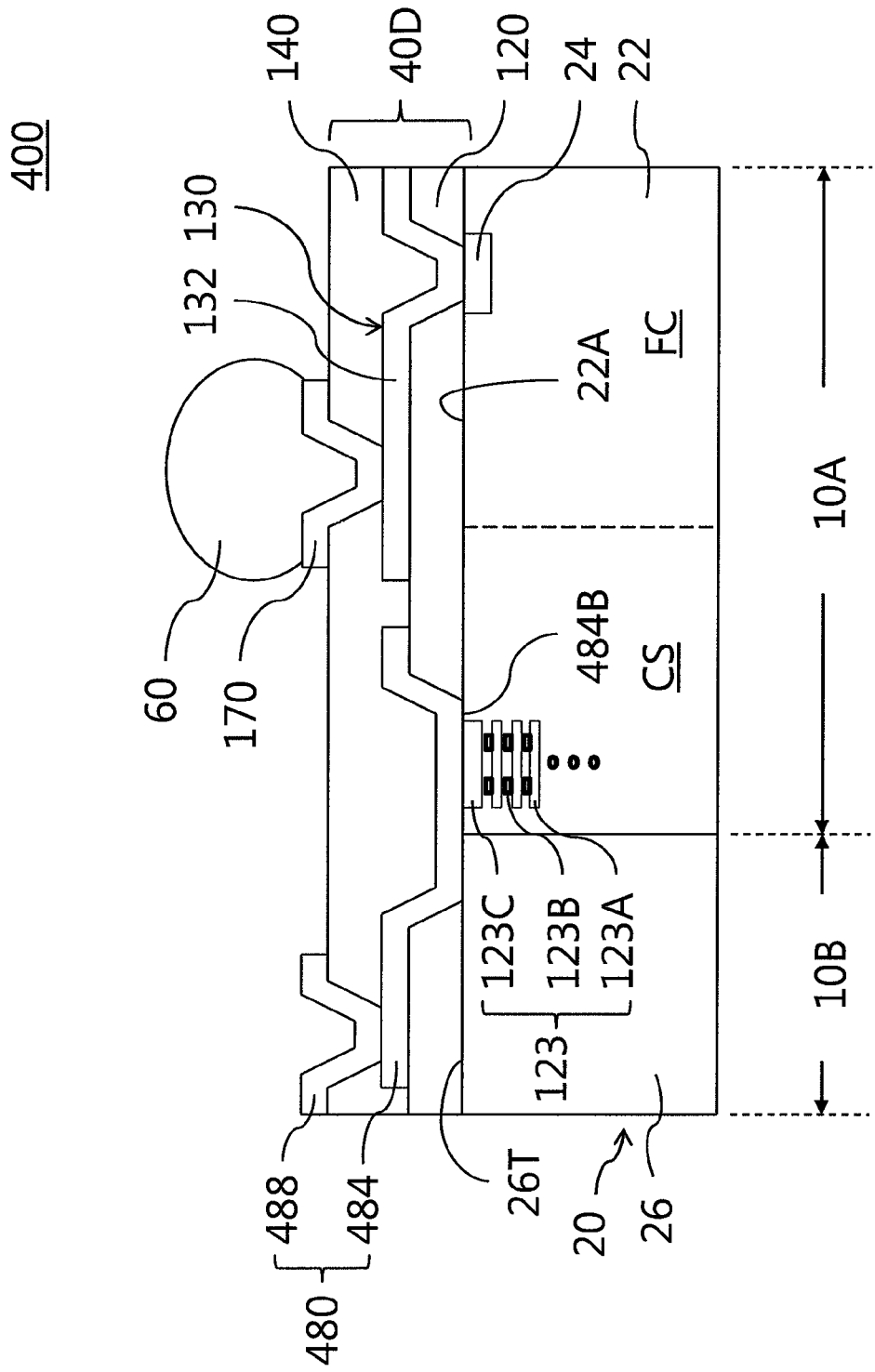
FIG. 5 is a cross-sectional view of a WLCSP according to still another embodiment.

Referring to FIG. 5, the WLCSP 400 has the same structure as the WLCSP 100 depicted in FIG. 2 except that the WLCSP 400 comprises a seal ring structure 480 including a lower seal layer 484 being in contact with both of the top surface 26T of the mold 26 and the active surface 22A of the semiconductor device 22. The lower seal layer 484 has a bottom surface 484B being in contact with the seal contact pad 123C of the chip seal ring 123. The seal ring structure 480 further includes a top seal layer 488 formed on and contacting with the lower seal layer 484.

The seal ring structure 480 connected to the chip seal ring 123 can effectively block the penetration of undesirable moisture or ionic contaminants, and can reinforce the structure of the WLCSP 400, thereby enhancing the reliability of the semiconductor device 22.

The seal ring structure 480 connected to the chip seal ring 123 can enhance the reliability of the semiconductor device 22 by more effectively blocking the penetration of undesirable moisture or ionic contaminants and by more effectively enabling structural reinforcement of the WLCSP 400.

Figure 6:
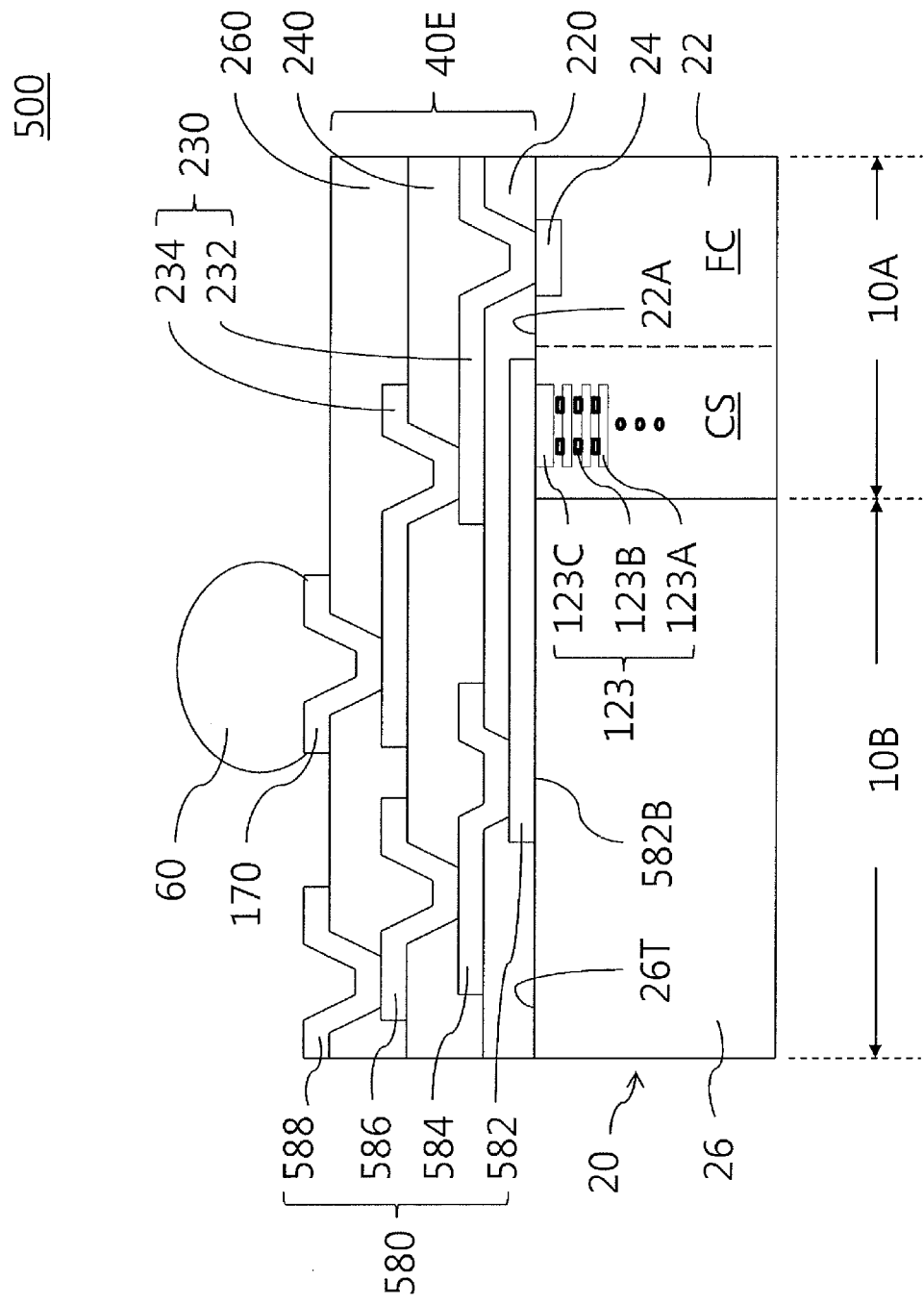
FIG. 6 is a cross-sectional view of a WLCSP according to still another embodiment.

Referring to FIG. 6, the WLCSP 500 has the same structure as the WLCSP 200 depicted in FIG. 3 except that the WLCSP 500 comprises a seal ring structure 580 including a bottom seal layer 582. The bottom seal layer 582 has a bottom surface 582B being in contact with the mold 26 and the active surface 22A of the semiconductor device 22, while covering the interface between the semiconductor device 22 and the mold 26. The bottom surface 582B of the bottom seal layer 582 is in contact with the seal contact pad 123C of the chip seal ring 123.

In the WLCSP 500, the seal ring structure 580 has a four-level structure including the bottom seal layer 582, a first lower seal layer 584, a second lower seal layer 586, and a top seal layer 588. The first lower seal layer 584 is connected to the bottom seal layer 582 and the second lower seal layer 586. The second lower seal layer 586 is connected to the first lower seal layer 584 and the top seal layer 588.

The first lower seal layer 584 extends on the same level as the first PPI line 232 and is spaced apart from the first PPI line 232. The second lower seal layer 586 extends on the same level as the second PPI line 234 and is spaced apart from the second PPI line 234. The top seal layer 588 extends on the same level as the UBM layer 170 and is spaced apart from the UBM layer 170. The solder ball 60 overlies the mold 26 with the seal ring structure 580 therebetween. Additionally, the solder ball 60 overlies the seal ring structure 580 with the first, second, and third insulation layers 220, 240, and 260 therebetween.

The seal ring structure 580 connected to the chip seal ring 123 can effectively block the penetration of undesirable moisture or ionic contaminants, and can reinforce the structure of the WLCSP 500, thereby enhancing the reliability of the semiconductor device 22.

Figure 7:
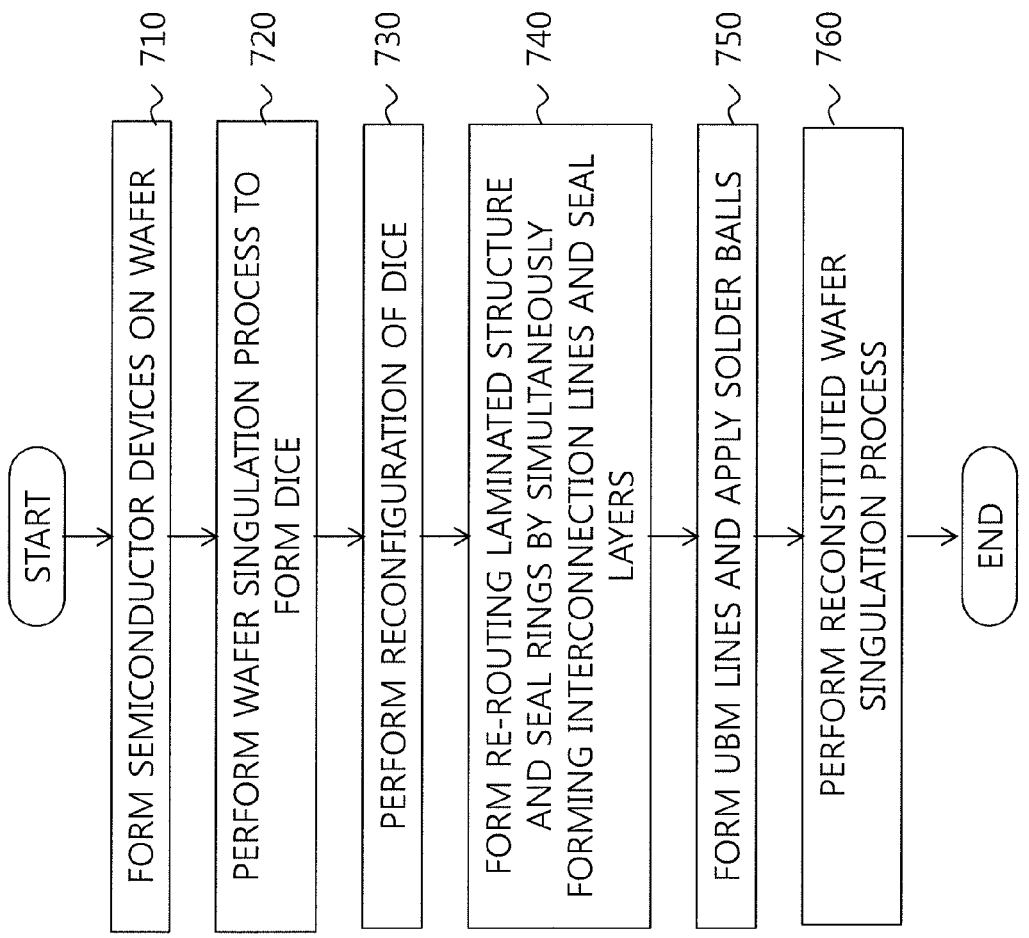
FIG. 7 is a flow chart for explaining a method of manufacturing a WLCSP according to an embodiment.

FIG. 7 is a flow chart for explaining a method of manufacturing a WLCSP according to an embodiment.

In operation 710, a plurality of semiconductor devices are formed on a wafer.

In operation 720, a wafer singulation process is performed with respect to the wafer using a sawing process to form a plurality of dies. In one or more embodiments, the plurality of dies comprise the semiconductor device 22 depicted in FIG. 1B.

Figure 8D:
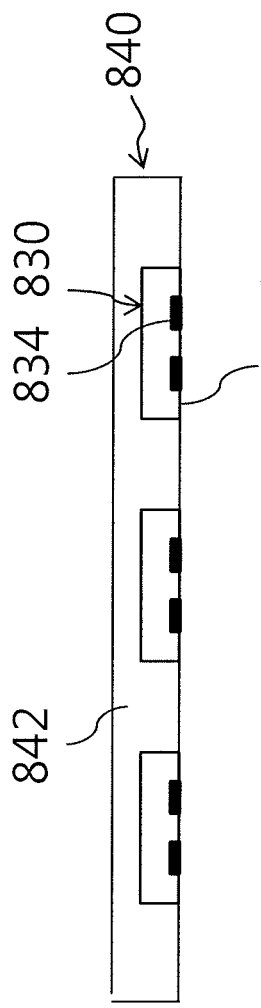

In operation 730, a reconfiguration of the plurality of dies is performed. In one or more embodiments, processes illustrated in FIGS. 8A-8D are performed for the reconfiguration of the plurality of dies. More specifically, a carrier 810 on which an adhesive tape 820 is laminated is prepared. A predetermined number of the dies 830 are placed on the adhesive tape 820. Each of the dies 830 includes an active surface 832 having contact pads 834. In some embodiments, the plurality of dies 830 comprises the semiconductor device 22 having the active surface 22A depicted in FIG. 1B. There are fewer number of dies 830 on the carrier 810 than on the wafer used for forming the semiconductor devices in operation 720. Therefore, there are wider pitches among the plurality of dies 830 on the carrier 810 than on the wafer used for forming the semiconductor devices in operation 720. Then, the carrier 810 on which the dies 830 are placed undergoes a compression molding process to form a reconstituted wafer 840 in which each of the dies 830 is covered with a mold 842. In one or more embodiments, the reconstituted wafer 840 comprises the molded semiconductor device 20 including the semiconductor device 22 and the mold 26 depicted in FIG. 1B. The carrier 810 and the adhesive tape 820 are sequentially removed to expose the active surfaces 832 of the dies 830 as depicted in FIG. 8D.

Figure 8E:
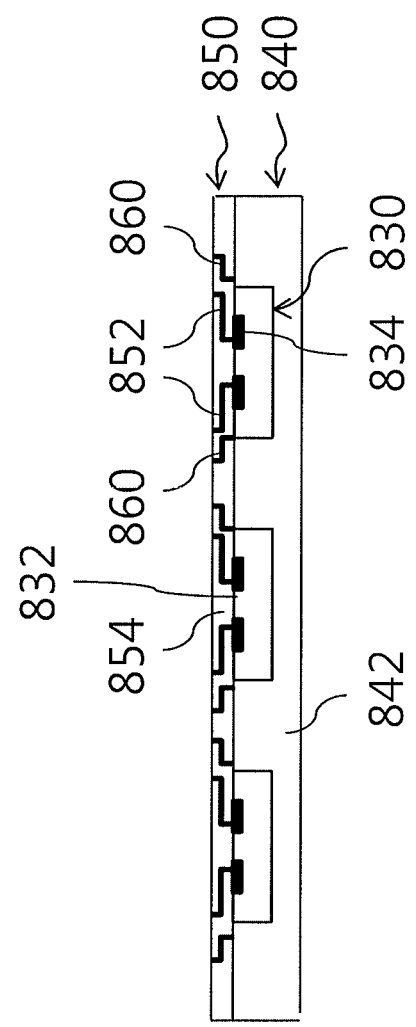

In operation 740, the reconstituted wafer 840 is reverted so that the active surfaces 832 of the dies 830 face upward as depicted in FIG. 8E. Then, a re-routing laminated structure 850 having redistribution layer (RDL) structures 852 and seal ring structures 860 are formed on the reconstituted wafer 840 by simultaneously forming interconnection lines of the RDL structures 852 and seal layers of the seal ring structures 860. The seal ring structures 860 are formed within and on the re-routing laminated structure 850. The seal ring structures 860 are insulated from the RDL structures 852 by an insulation structure 854. In one or more embodiments, the insulation structure 854 has a plurality of insulation layers. Each of the seal ring structures 860 extends around the upper periphery of each of the dies 830 on the mold 842. The seal ring structures 860 have top surfaces exposed through the re-routing laminated structure 850. Each of the RDL structures 852 is electrically connected to at least one of the contact pads 834. In one or more embodiments, the seal ring structures 860 comprise the seal ring structure 80 depicted in FIG. 1A. In one or more embodiments, the re-routing laminated structure 850 comprises at least one of the re-routing laminated structures 40, 40A, 40B, 40C, 40D, and 40E depicted in FIGS. 1A and 2-6. In some embodiments, at least one of the RDL structures 130 and 230 depicted in FIGS. 2-6 is formed in the re-routing laminated structure 850. In one or more embodiments, the seal ring structures 860 comprise at least one of the seal ring structures 80, 180, 280, 380, 480, and 580 depicted in FIGS. 1A and 2-6.

Figure 8F:
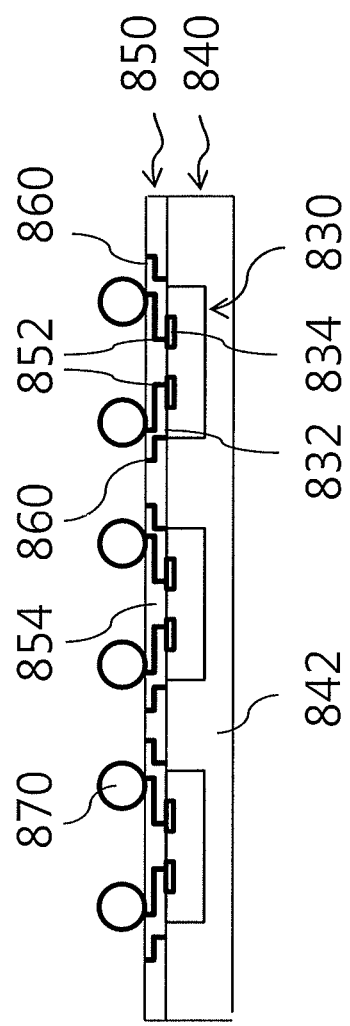

In operation 750, a plurality of UBM layers is formed on the re-routing laminated structure 850. In some embodiments, the plurality of UBM layers comprise the UBM layer 170 depicted in FIGS. 2-6. Then, a plurality of signal I/O solder balls 870 is applied to the UBM layers formed on the re-routing laminated structures 850, as depicted in FIG. 8F. In one or more embodiments, the solder balls 870 comprise at least one of the solder balls 60 depicted in FIGS. 1A and 2-6.

Figure 8G:
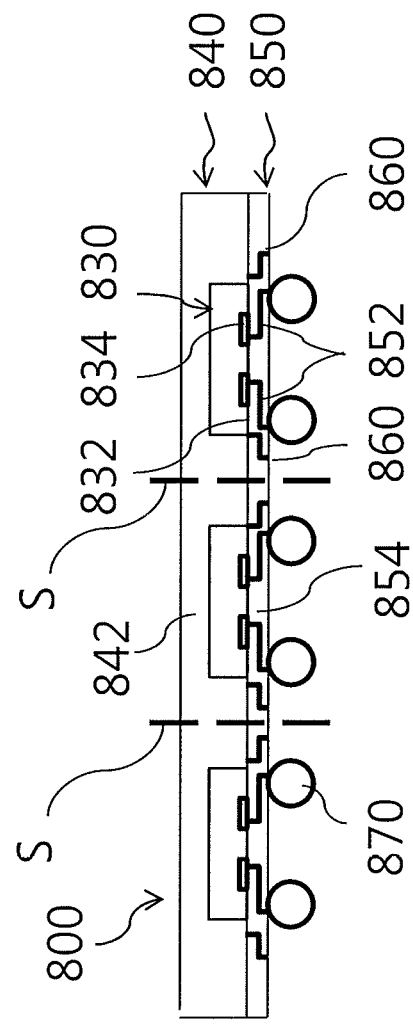

In operation 760, a reconstituted wafer singulation process is performed by sawing the resultant structure having the re-routing laminated structure 850 and the solder balls 870. For the reconstituted wafer singulation process, the sawing is performed along sawing paths indicated as dotted lines S in FIG. 8G, thereby forming a plurality of packages 800. In some embodiments, the packages 800 comprise at least one of the WLCSPs 10, 100, 200, 300, 400, and 500 depicted in FIGS. 1A and 2-6.

FIGS. 9A-9F are cross-sectional views for an exemplary method of manufacturing the WLCSP 100 depicted in FIG. 2.

Figure 9A:
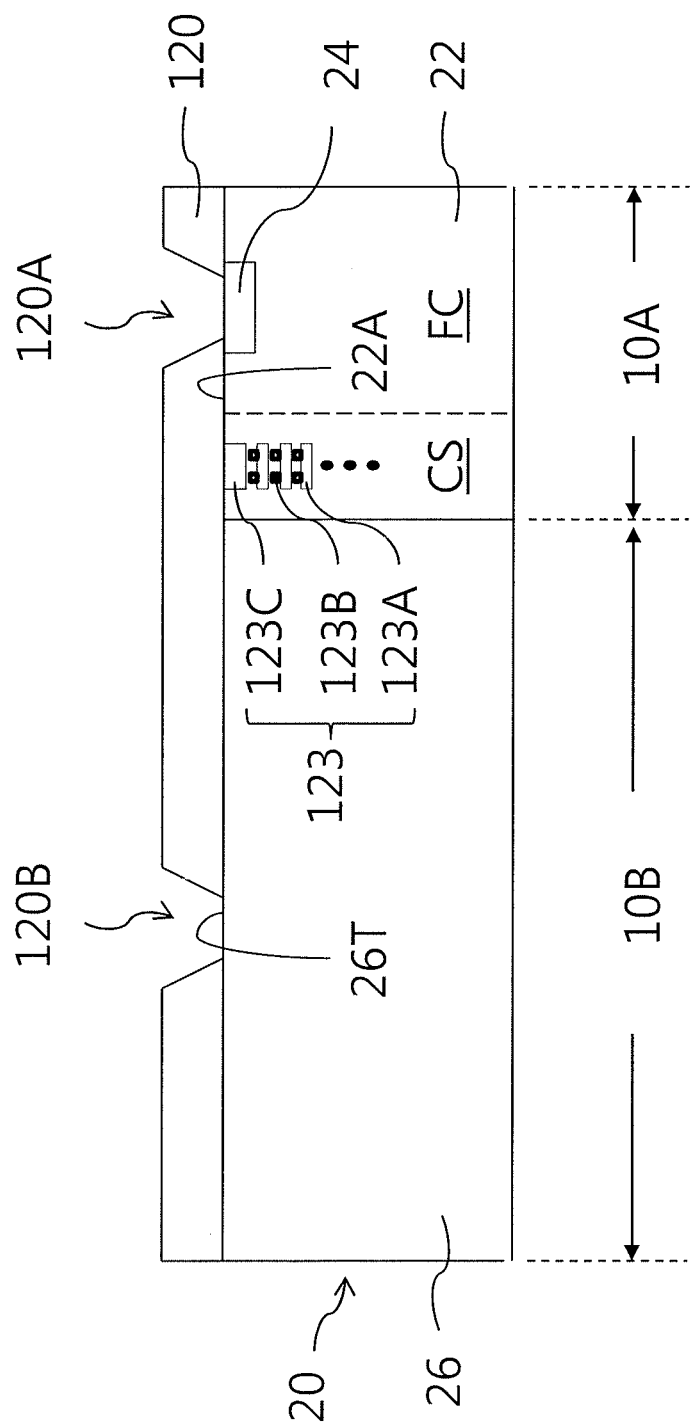
FIGS. 9A-9F are cross-sectional views for a method of manufacturing a WLCSP according to still another embodiment.

Referring to FIG. 9A, the molded semiconductor device 20 including the semiconductor device 22 and the mold 26 is prepared. In one or more embodiments, the molded semiconductor 20 is included in the reconstituted wafer 840 prepared by performing the processes described with reference to FIGS. 8A-8D, according to operations 710, 720, and 730 of FIG. 7. The first insulation layer 120 is formed on the molded semiconductor device 20. In some embodiments, the first insulation layer 120 is formed by a spin coating process. In one or more embodiments, the first insulation layer 120 is formed of at least one of PBO, BCB, PI, or epoxy, but is not limited by the above-mentioned materials. Then, the first insulation layer 120 is patterned by using a photolithography process to form the first via opening 120A exposing the contact pad 24, and the second via opening 120B exposing the top surface 26T of the mold 26. In some embodiments, the first insulation layer 120 is cured after the first via opening 120A and the second via opening 120B are formed.

Figure 9B:
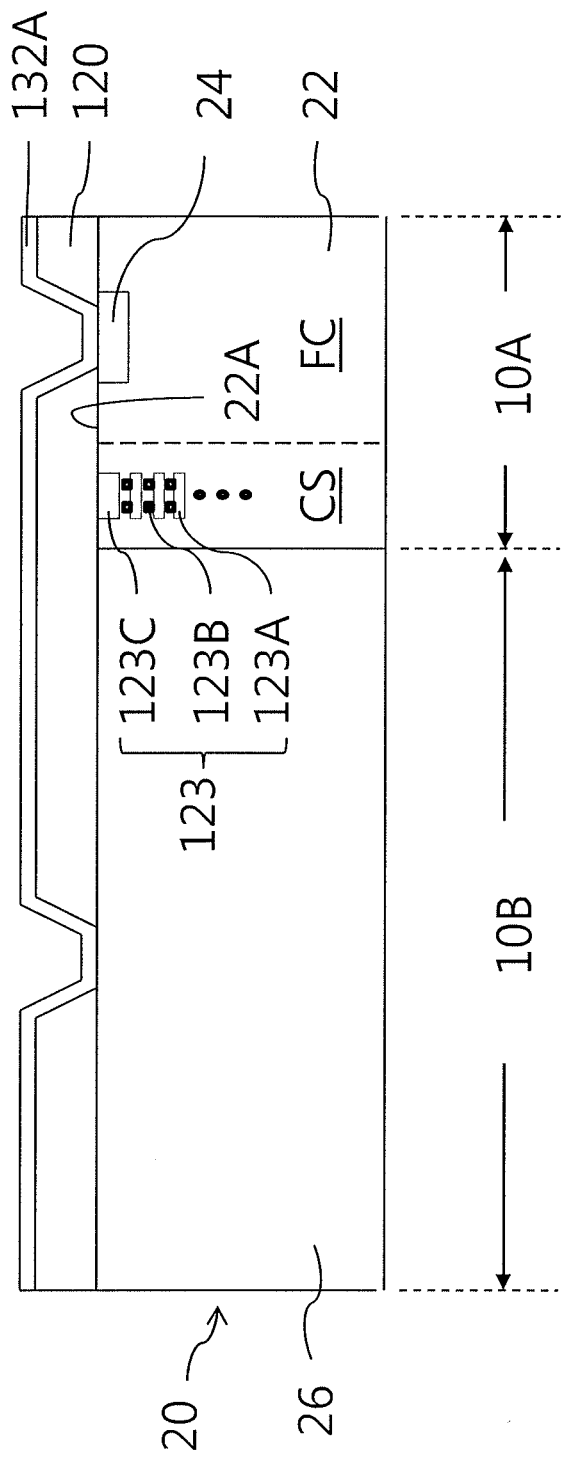

Referring to FIG. 9B, a first metallic layer 132A is blanket formed on the resultant structure having the first insulation layer 120. The first metallic layer 132A covers exposed surfaces of the first insulation layer 120, the exposed contact pad 24, and the exposed top surface 26T of the mold 26. In some embodiments, the first metallic layer 132A includes an adhesion layer and a seed layer formed on the adhesion layer. In some embodiments, the adhesion layer includes at least one of Ti, TiN, Ta, or TaN, but is not limited by the above-mentioned materials. In one or more embodiments, the adhesion layer is formed by a physical vapor deposition (PVD) process. In some embodiments, the seed layer includes at least one of Cu, Al, Ag, Au, or Ni, but is not limited by the above-mentioned materials. In one or more embodiments, the seed layer is formed by a PVD process or an electroless plating process.

Figure 9C:
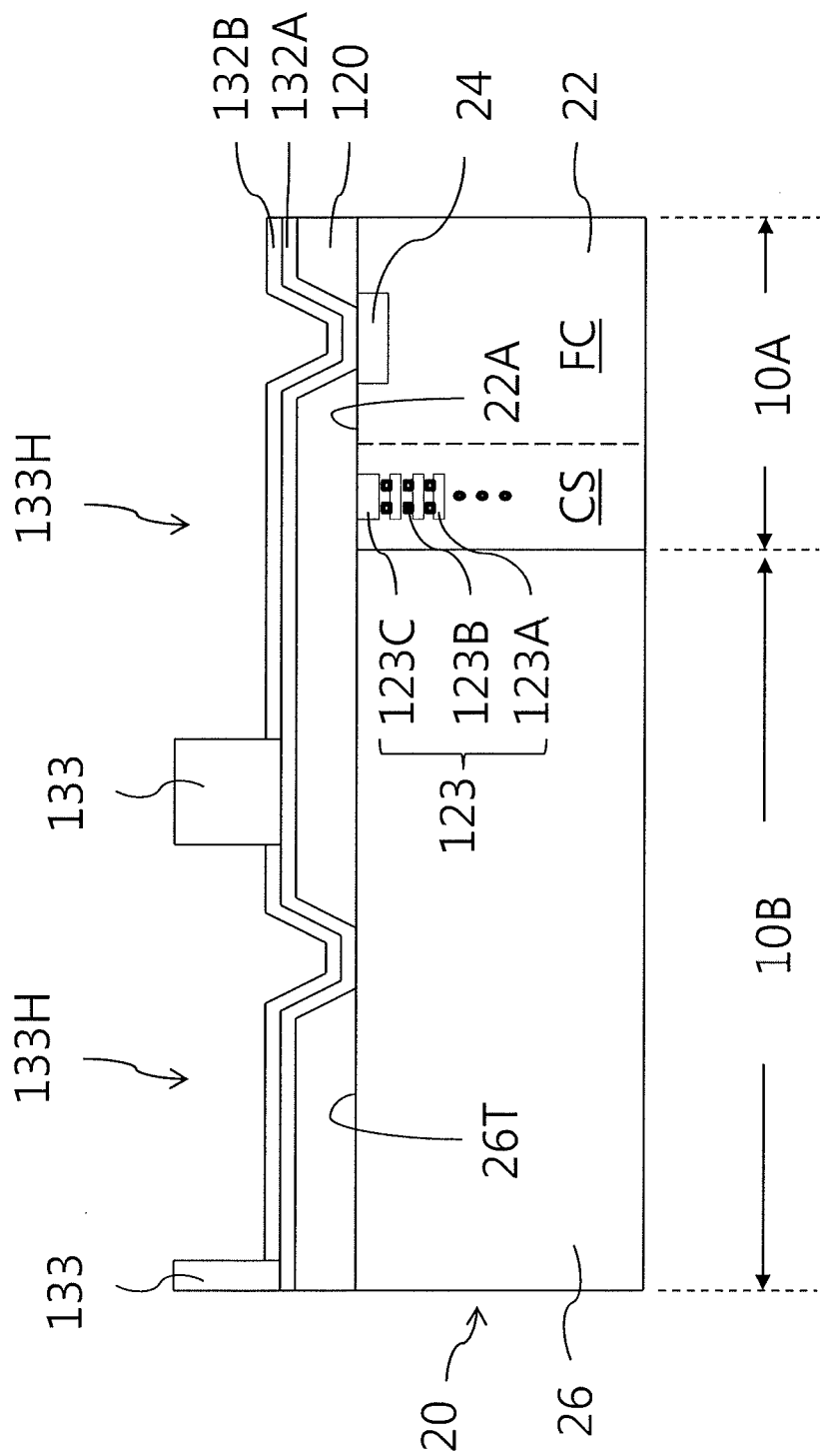

Referring to FIG. 9C, a mask pattern 133 is formed on the first metallic layer 132A. In some embodiments, the mask pattern 133 is formed of photoresist material. The mask pattern 133 has openings 133H through which portions of the first metallic layer 132A are exposed. Then, second metallic layers 132B are formed on the first metallic layer 132A within the openings 133H. In one or more embodiments, the second metallic layers 132B include at lease one of Cu, Al, Ag, Au, or Ni, but are not limited by the above-mentioned materials. In some embodiments, the second metallic layers 132B are formed by a sputtering process, a printing process, an electroplating process, an electroless plating process, a chemical vapor deposition (CVD) process, or combinations thereof.

Figure 9D:
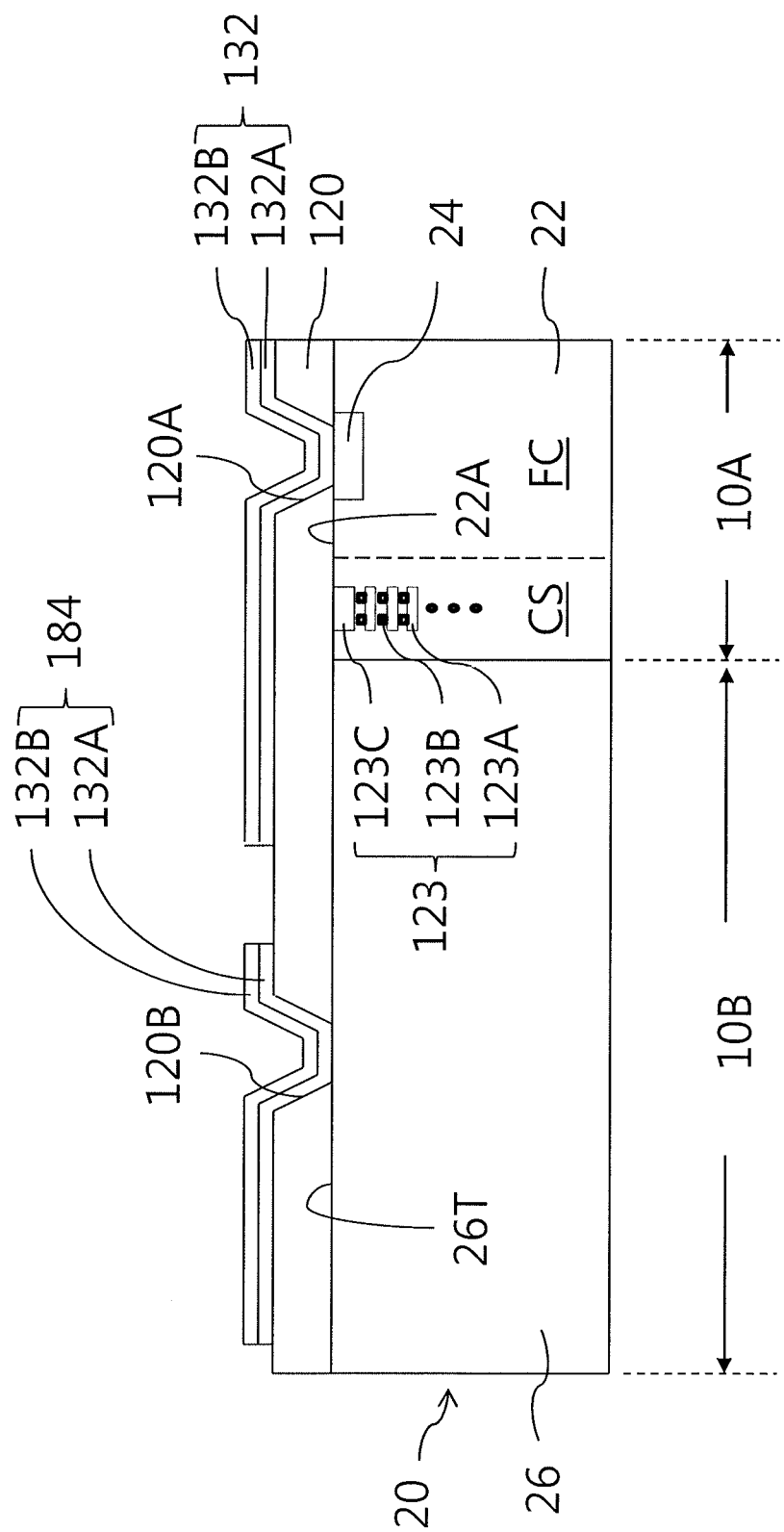

Referring to FIG. 9D, the mask pattern 133 is removed to expose the first metallic layer 132A through the second metallic layers 132B. Then, exposed portions of the first metallic layer 132A is removed to expose the first insulation layer 120 through the second metallic layers 132B, thereby simultaneously forming the PPI line 132 and the lower seal layer 184. In some embodiments, the exposed portions of the first metallic layer 132A are removed by a wet etching process. Each of the PPI line 132 and the lower seal layer 184 comprises a stack structure of the first metallic layer 132A and the second metallic layer 132B. The PPI line 132 extends on the first insulation layer 120 and on inner walls of the first via opening 120A so that the PPI line 132 can be in contact with the contact pad 24. The lower seal layer 184 extends on the first insulation layer 120 and on inner walls of the second via opening 120B so that the lower seal layer 184 can be in contact with the mold 26. In some embodiments, the PPI line 132 and the lower seal layer 184 have a thickness in a range of about 2 to 8 micrometers (μm).

Figure 9E:
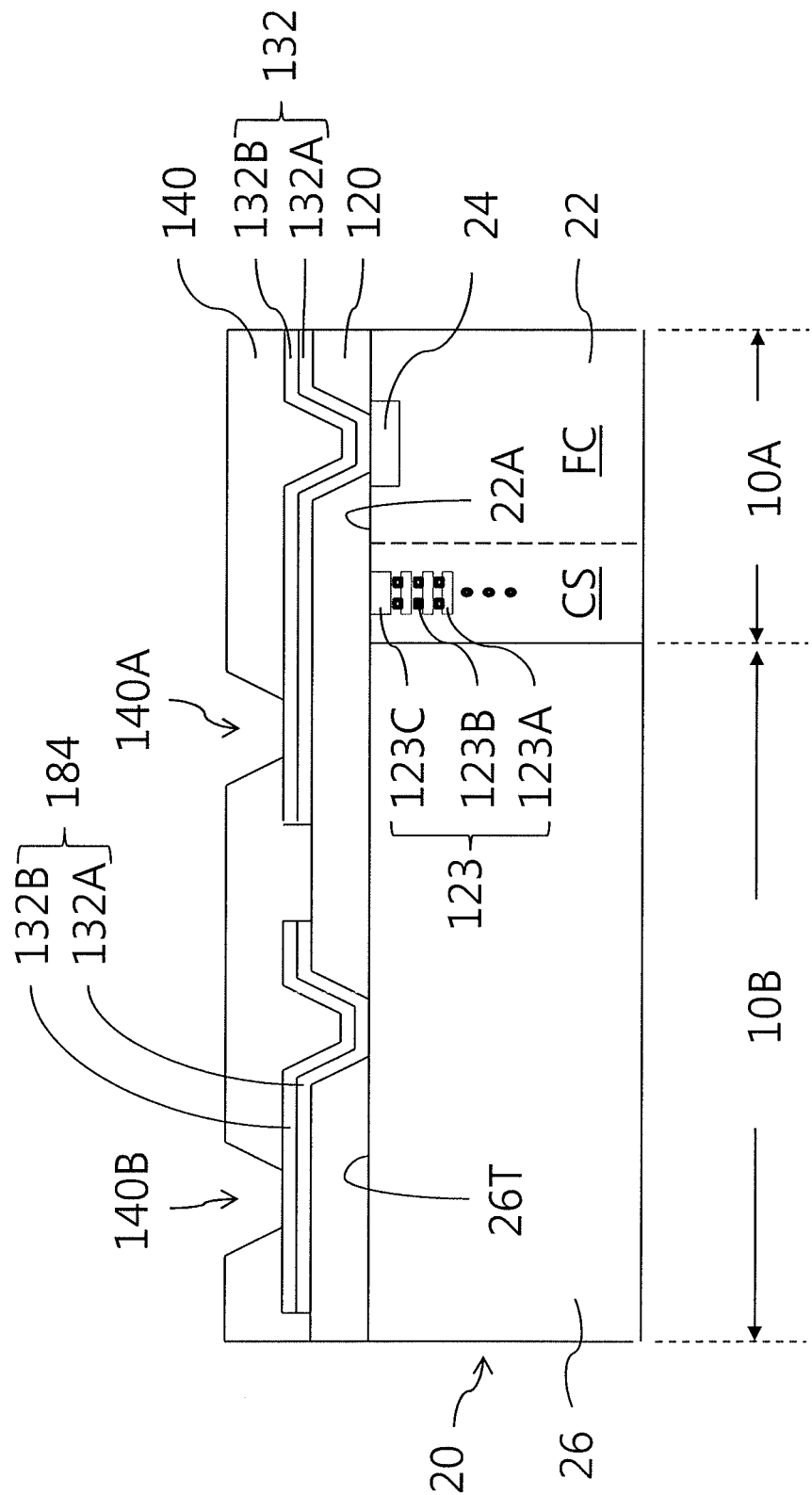

Referring to FIG. 9E, the second insulation layer 140 is formed on the resultant structure having the PPI line 132 and the lower seal layer 184 by using essentially the same method as forming the first insulation layer 120. Then, the second insulation layer 140 is patterned by using a photolithography process to form the first via opening 140A exposing the PPI line 132, and the second via opening 140B exposing the lower seal layer 184.

Figure 9F:
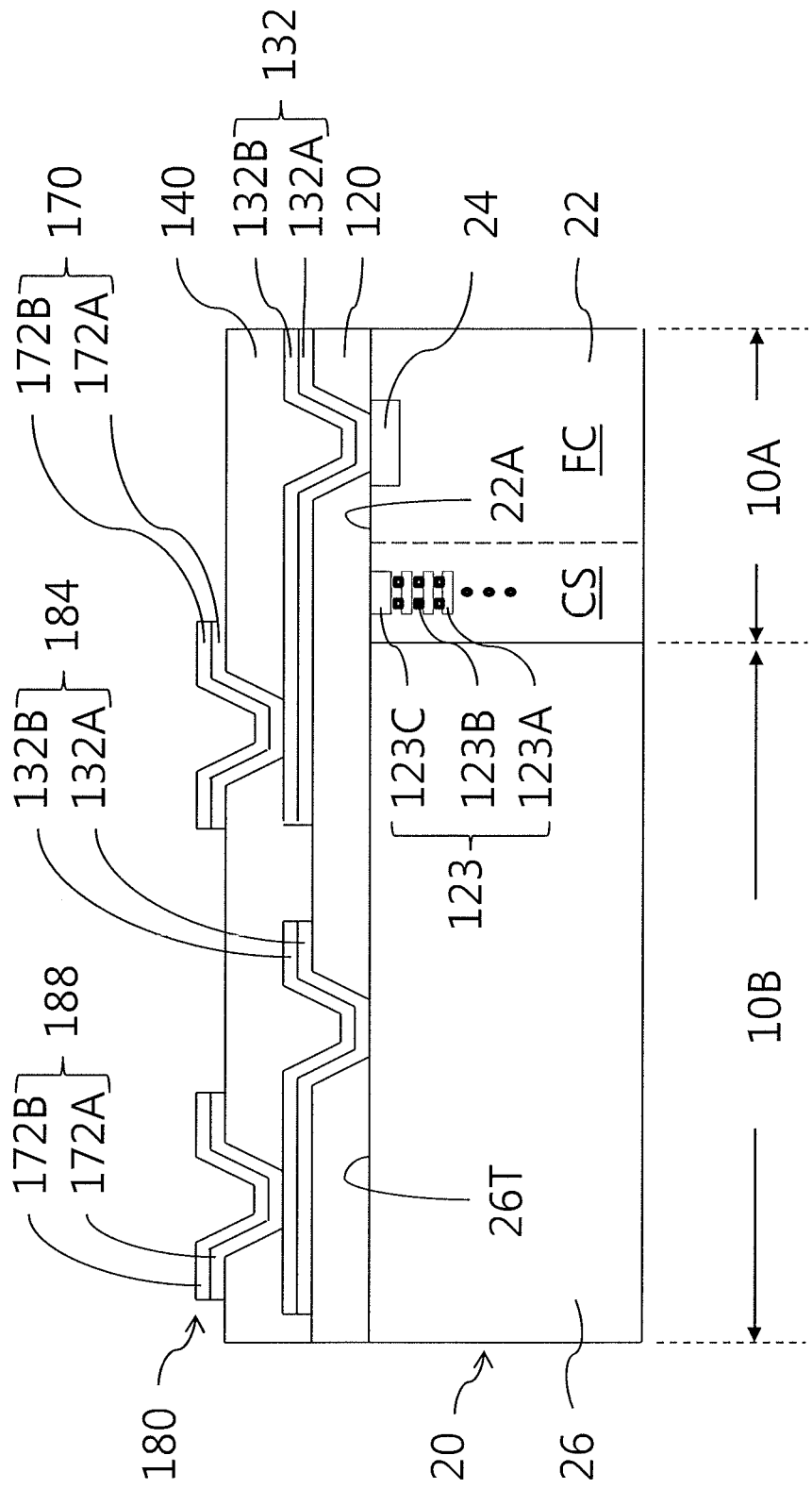

Referring to FIG. 9F, a plurality of stack structures of a first metallic layer 172A and a second metallic layer 172B is formed by using essentially the same method as forming the stack structures of the first metallic layer 132A and the second metallic layer 132B described with reference to FIGS. 9B-9D, thereby simultaneously forming the UBM layer 170 and the top seal layer 188. In some embodiments, the UBM layer 170 and the top seal layer 188 have a thickness in a range of about 2 to 8 μm. Then, the solder ball 60 is mounted on the UBM layer 170 to form the WLCSP 100 depicted in FIG. 2. In one or more embodiments, a metal bump instead of the solder ball 60 is formed on the UBM layer 170.

In the following embodiments, the features are the same as, or similar to, like-numbered features described in FIGS. 9A-9F. Therefore, the descriptions thereof will be omitted to avoid repetition.

Figure 10A:
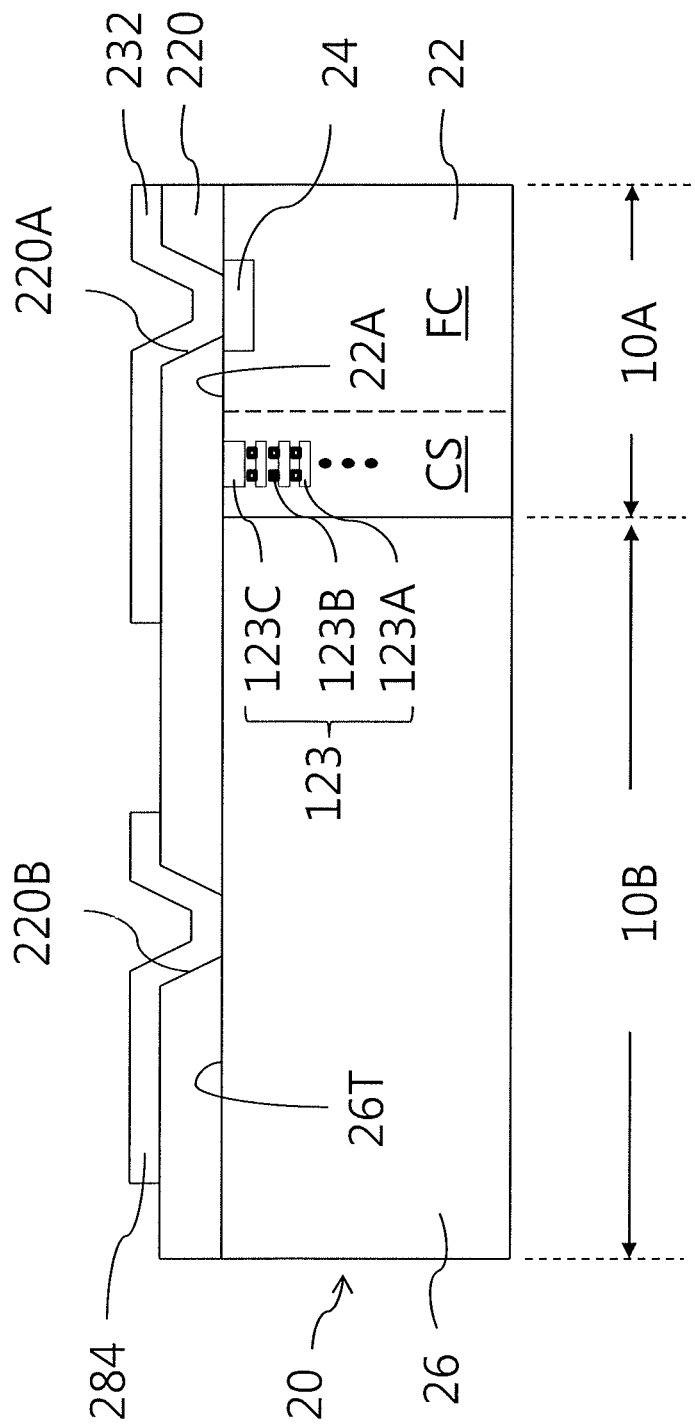
FIGS. 10A-10C are cross-sectional views for a method of manufacturing a WLCSP according to still another embodiment.
Figure 10B:
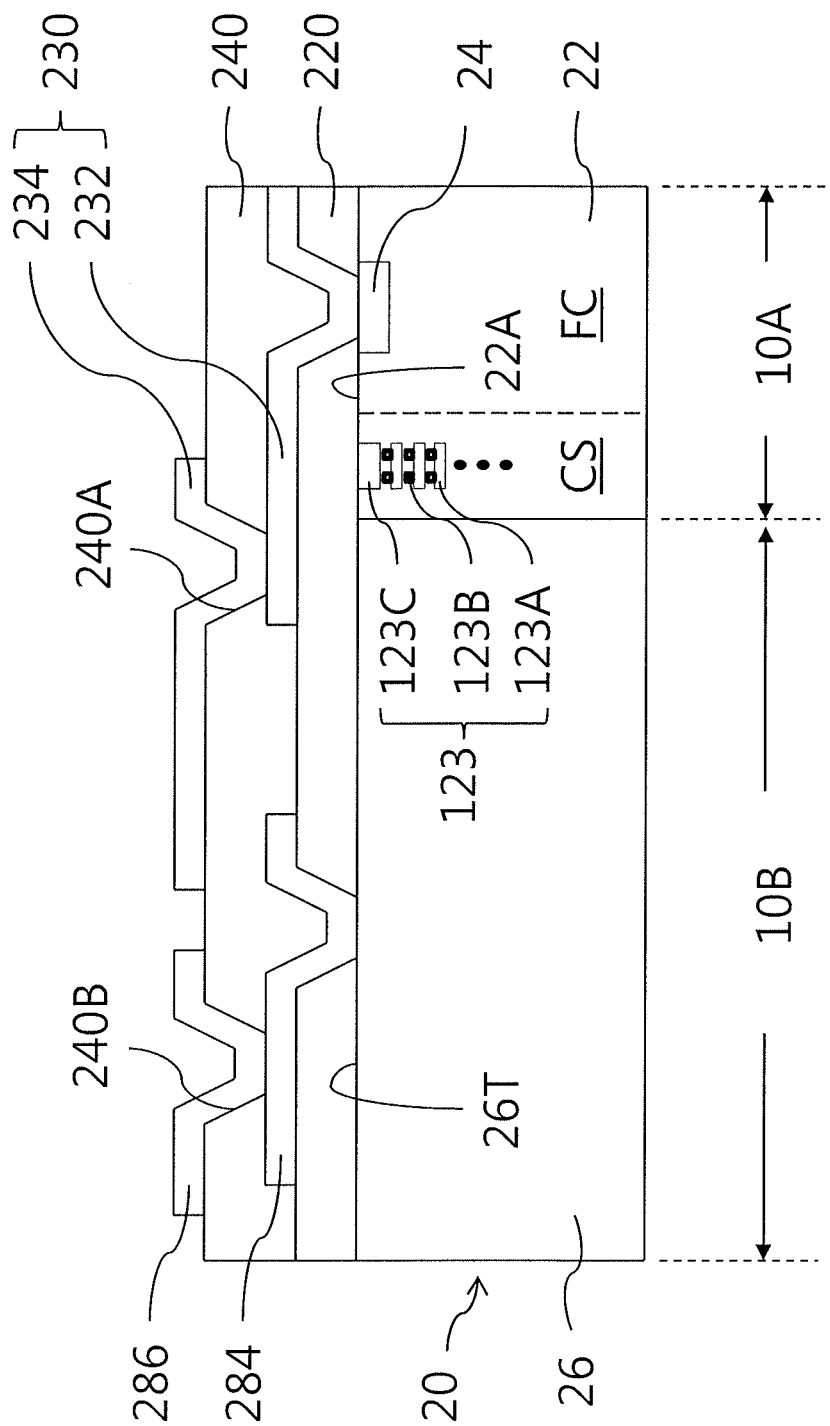
Figure 10C:
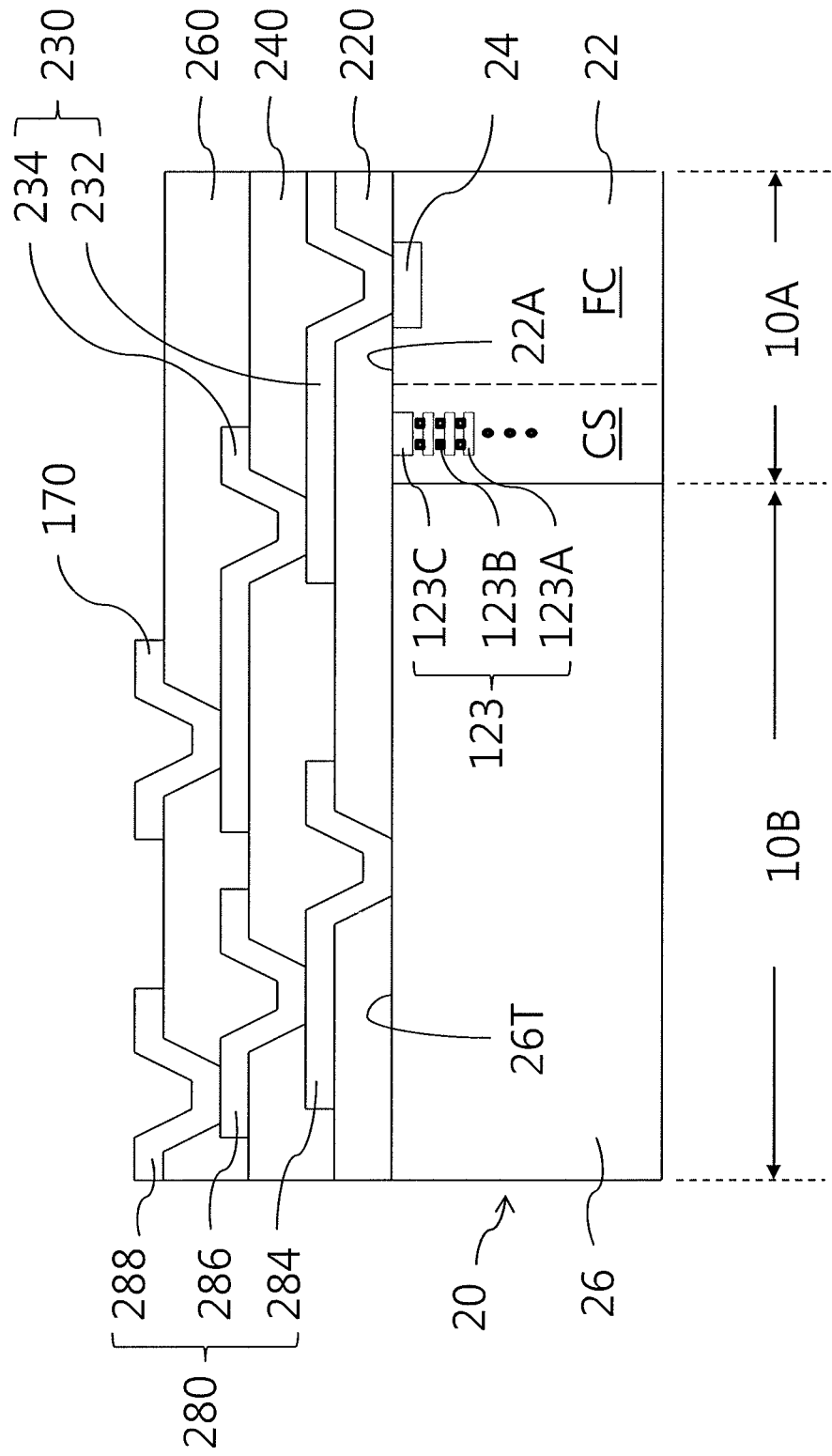

FIGS. 10A-10C are cross-sectional views for an exemplary method of manufacturing the WLCSP 200 depicted in FIG. 3.

Referring to FIG. 10A, the first insulation layer 220 is formed on the molded semiconductor device 20 by using essentially the same method as forming the first insulation layer 120 described with reference to FIG. 9A. The first insulation layer 220 is formed to have a first via opening 220A exposing the contact pad 24, and a second via opening 220B exposing the mold 26. Then, the first PPI line 232 and the first lower seal layer 284 are simultaneously formed on the first insulation layer 220 and within the first and second via openings 220A and 220B by using essentially the same method as forming the PPI line 132 and the lower seal layer 184 described with reference to FIGS. 9B-9D.

Referring to FIG. 10B, the second insulation layer 240 is formed on the resultant structure having the first PPI line 232 and the first lower seal layer 284. The second insulation layer 240 is formed to have a first via opening 240A exposing the first PPI line 232 and a second via opening 240B exposing the first lower seal layer 284. Then, the second PPI line 234 and the second lower seal layer 286 are simultaneously formed on the second insulation layer 240 and within the first and second via openings 240A and 240B.

Referring to FIG. 10C, the third insulation layer 260 is formed on the resultant structure having the second PPI line 234 and the second lower seal layer 286. Then, the UBM layer 170 and the top seal layer 288 are simultaneously formed on the third insulation layer 260. Then, the solder ball 60 is mounted on the UBM layer 170 to form the WLCSP 200 depicted in FIG. 3.

Figure 11A:
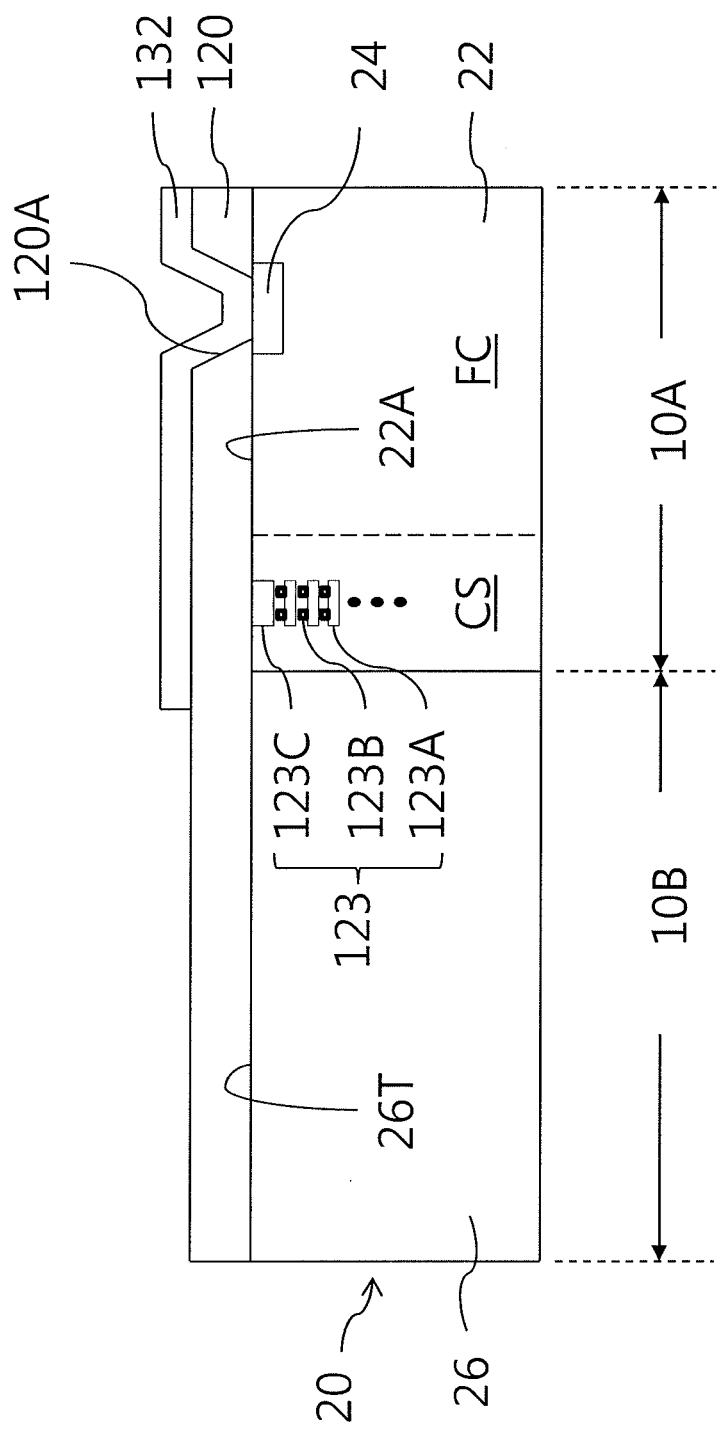
FIGS. 11A and 11B are cross-sectional views for a method of manufacturing a WLCSP according to still another embodiment.
Figure 11B:
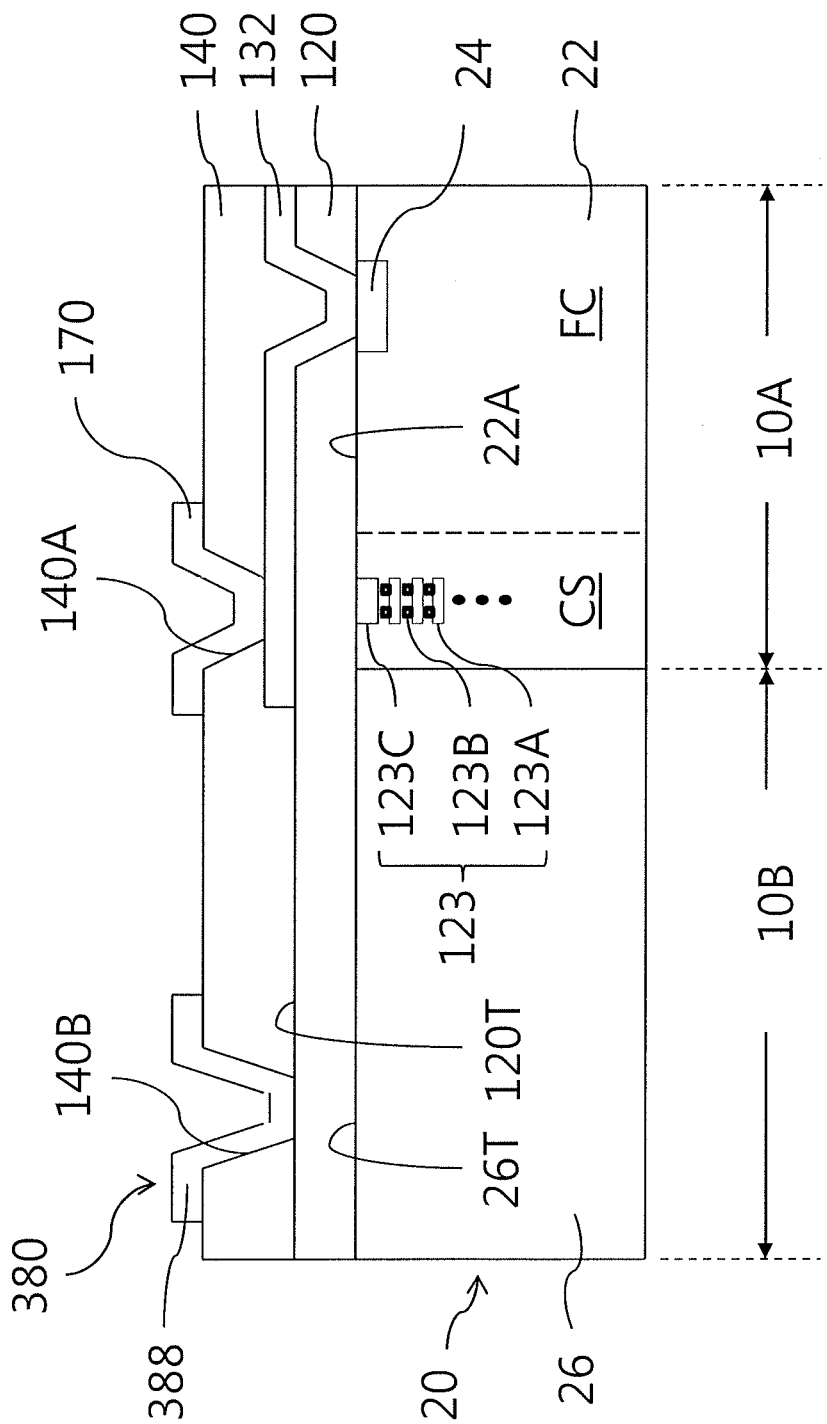

FIGS. 11A and 11B are cross-sectional views for an exemplary method of manufacturing the WLCSP 300 depicted in FIG. 4.

Referring to FIG. 11A, the first insulation layer 120 is formed on the molded semiconductor device 20. The first insulation layer 120 is formed to have the first via opening 120A exposing the contact pad 24. Then, the first PPI line 132 is formed on the first insulation layer 120 and within the first via opening 120A so that the first PPI line 132 can be in contact with the contact pad 24.

Referring to FIG. 11B, the second insulation layer 140 is formed on the resultant structure having the first PPI line 132. The second insulation layer 140 is formed to have the first via opening 140A exposing the PPI line 132, and the second via opening 140B exposing the top surface 120T of the first insulation layer 120. The UBM layer 170 and the top seal layer 388 are simultaneously formed on the second insulation layer 140. The top seal layer 388 is formed to be in contact with the top surface 120T of the first insulation layer 120. Then, the solder ball 60 is mounted on the UBM layer 170 to form the WLCSP 300 depicted in FIG. 4.

Figure 12A:
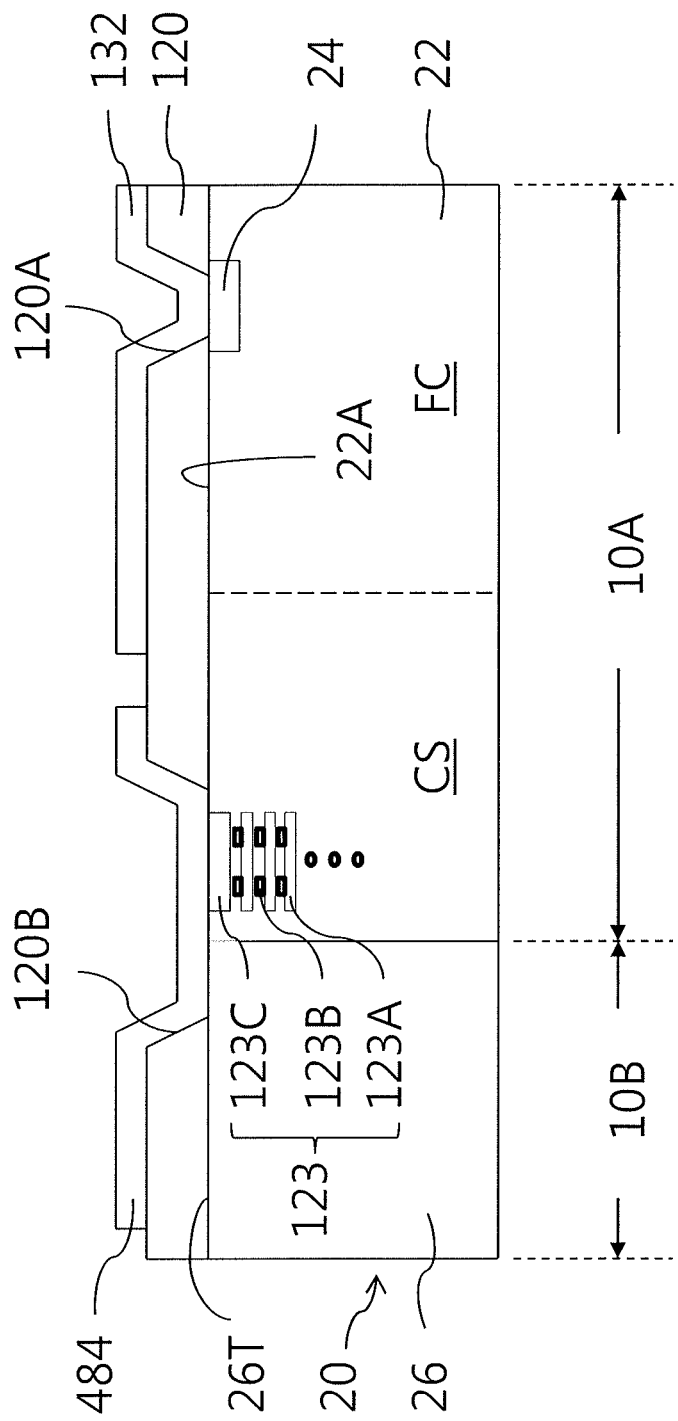
FIGS. 12A-12B are cross-sectional views for a method of manufacturing a WLCSP according to still another embodiment.
Figure 12B:
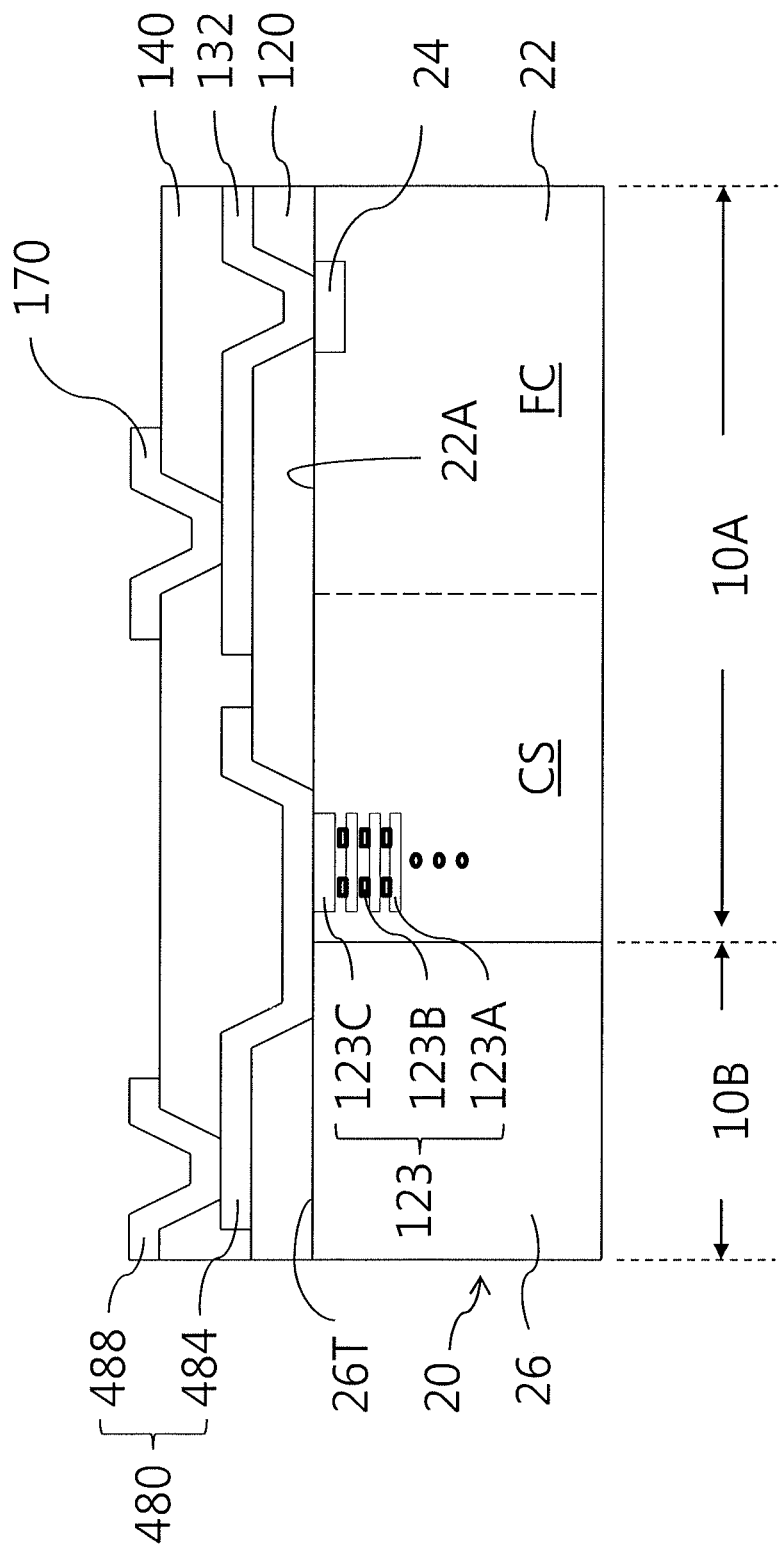

FIGS. 12A and 12B are cross-sectional views for an exemplary method of manufacturing the WLCSP 400 depicted in FIG. 5.

Referring to FIG. 12A, the first insulation layer 120 is formed on the molded semiconductor device 20. The first insulation layer 120 is formed to have the first via opening 120A exposing the contact pad 24, and the second via opening 120B exposing the mold 26 and the seal contact pad 123C of the chip seal ring 123. Then, the first PPI line 132 and the lower seal layer 484 are simultaneously formed on the first insulation layer 120. The lower seal layer 484 is formed to be in contact with the mold 26 and the seal contact pad 123C of the chip seal ring 123.

Referring to FIG. 12B, the second insulation layer 140 is formed on the resultant structure having the first PPI line 132 and the lower seal layer 484. The UBM layer 170 and the top seal layer 488 are simultaneously formed on the second insulation layer 140. The top seal layer 488 is formed to be in contact with the lower seal layer 484. Then, the solder ball 60 is mounted on the UBM layer 170 to form the WLCSP 400 depicted in FIG. 5.

FIGS. 13A-13D are cross-sectional views for an exemplary method of manufacturing the WLCSP 500 depicted in FIG. 6.

Figure 13A:
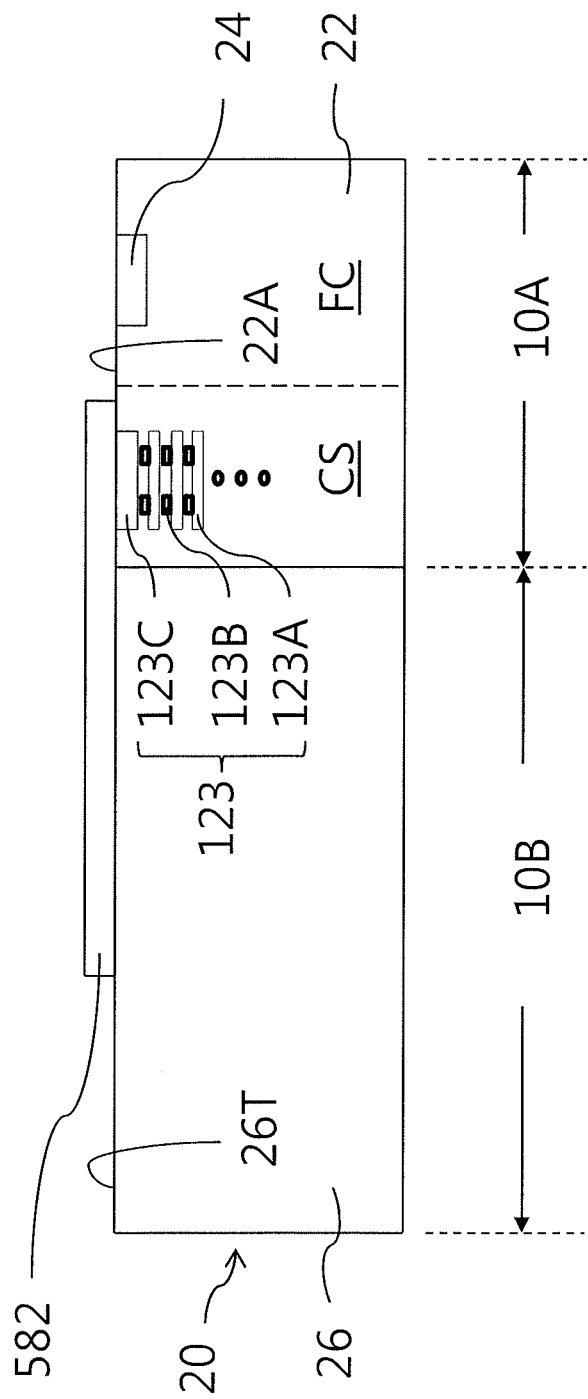
FIGS. 13A-13D are cross-sectional views for a method of manufacturing a WLCSP according to still another embodiment.

Referring to FIG. 13A, the bottom seal layer 582 is formed on the molded semiconductor device 20. The bottom seal layer 582 is formed to extend from the fan-out area 10B to the chip area 10A while contacting the top surface 26T of the mold 26 and the active surface 22A of the semiconductor device 22. The bottom seal layer 582 is formed to be connected to the seal contact pad 123C of the chip seal ring 123. In some embodiments, the bottom seal layer 582 is formed by using essentially the same method as forming the lower seal layer 184 described with reference to FIGS. 9B-9D.

Figure 13B:
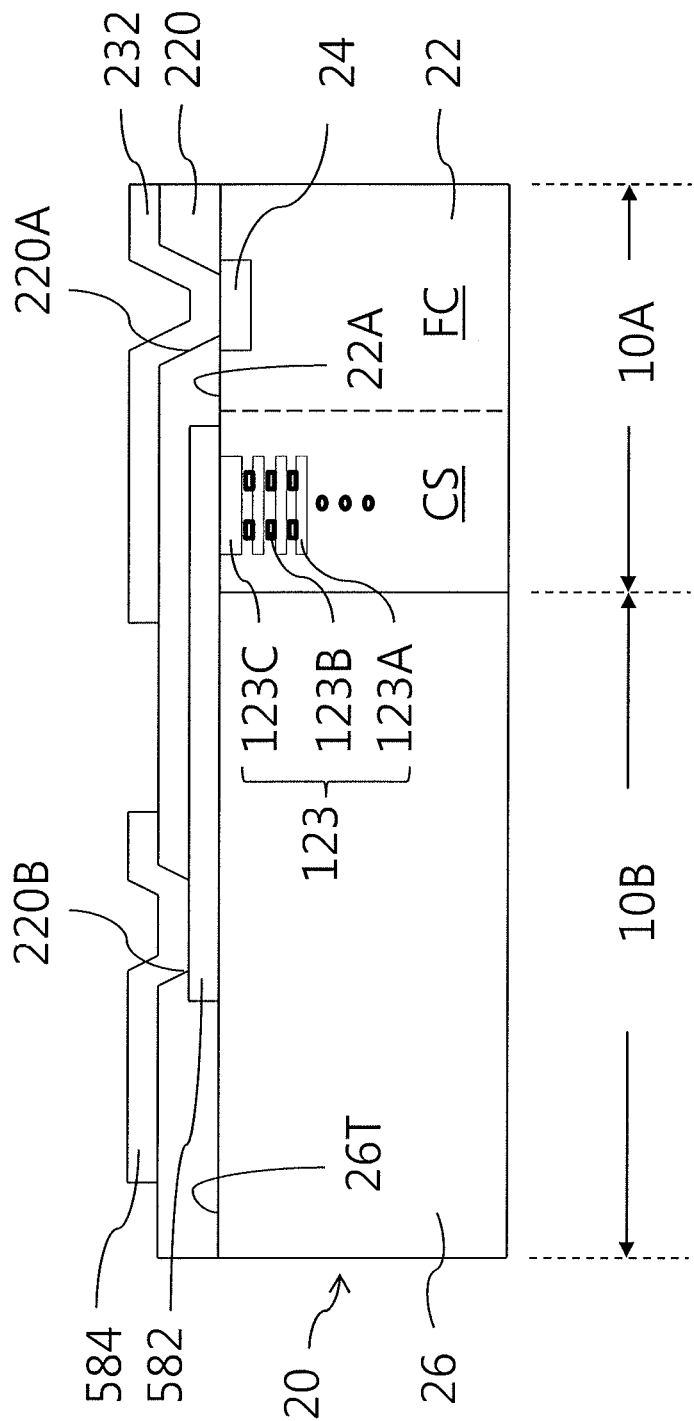

Referring to FIG. 13B, the first insulation layer 220 is formed on the resultant structure having the bottom seal layer 582. The first insulation layer 220 is formed to have the first via opening 220A exposing the contact pad 24, and the second via opening 220B exposing a portion of the bottom seal layer 582. Then, the first PPI line 232 and the first lower seal layer 584 are simultaneously formed on the first insulation layer 220. The first PPI line 232 is formed to be connected to the contact pad 24. The first lower seal layer 584 is formed to be connected to the bottom seal layer 582.

Figure 13C:
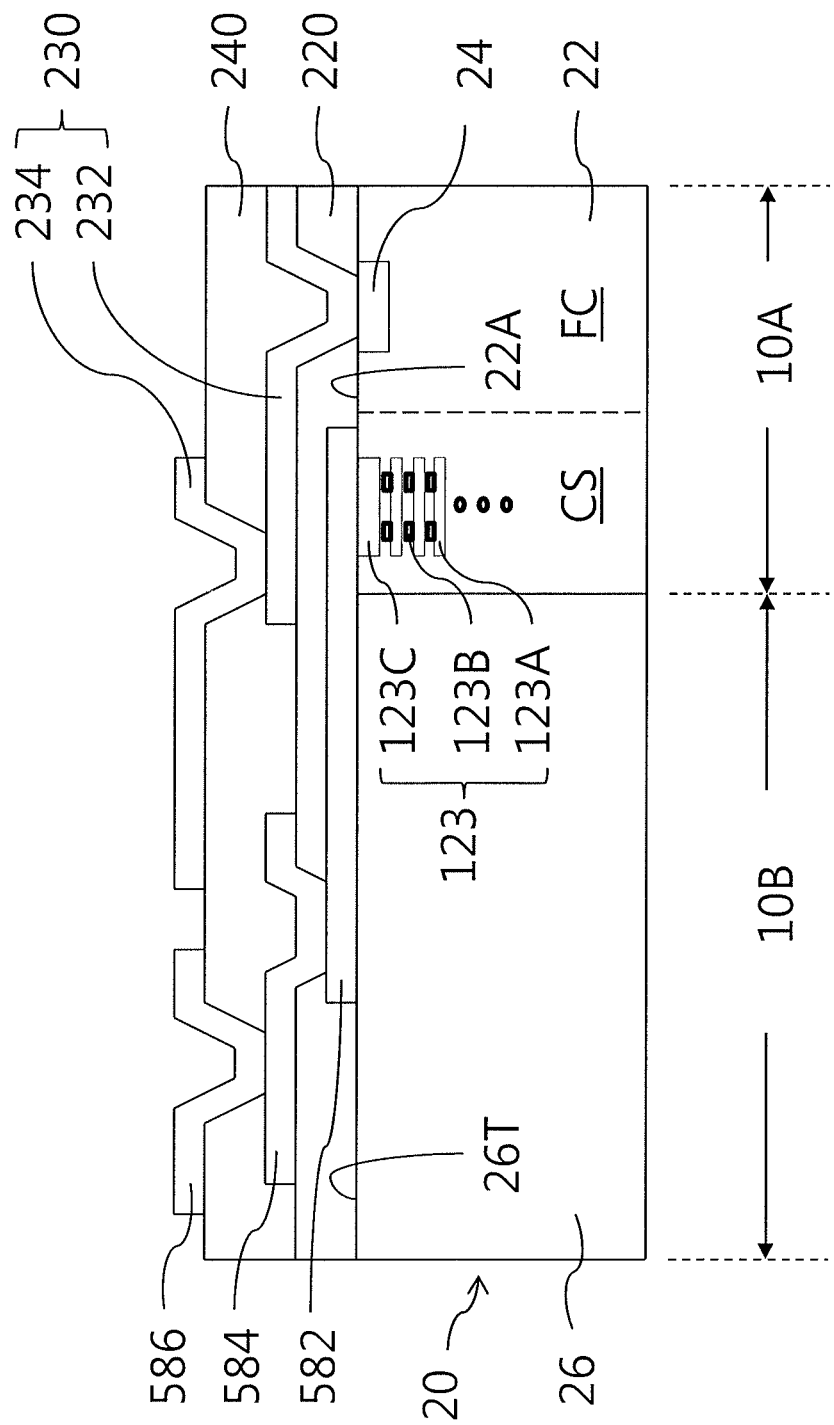

Referring to FIG. 13C, the second insulation layer 240 is formed on the resultant structure having the first PPI line 232 and the first lower seal layer 584. Then, the second PPI line 234 and the second lower seal layer 586 are simultaneously formed on the second insulation layer 240. The second PPI line 234 is formed to be connected to the first PPI line 232. The second lower seal layer 586 is formed to be connected to the first lower seal layer 584.

Figure 13D:
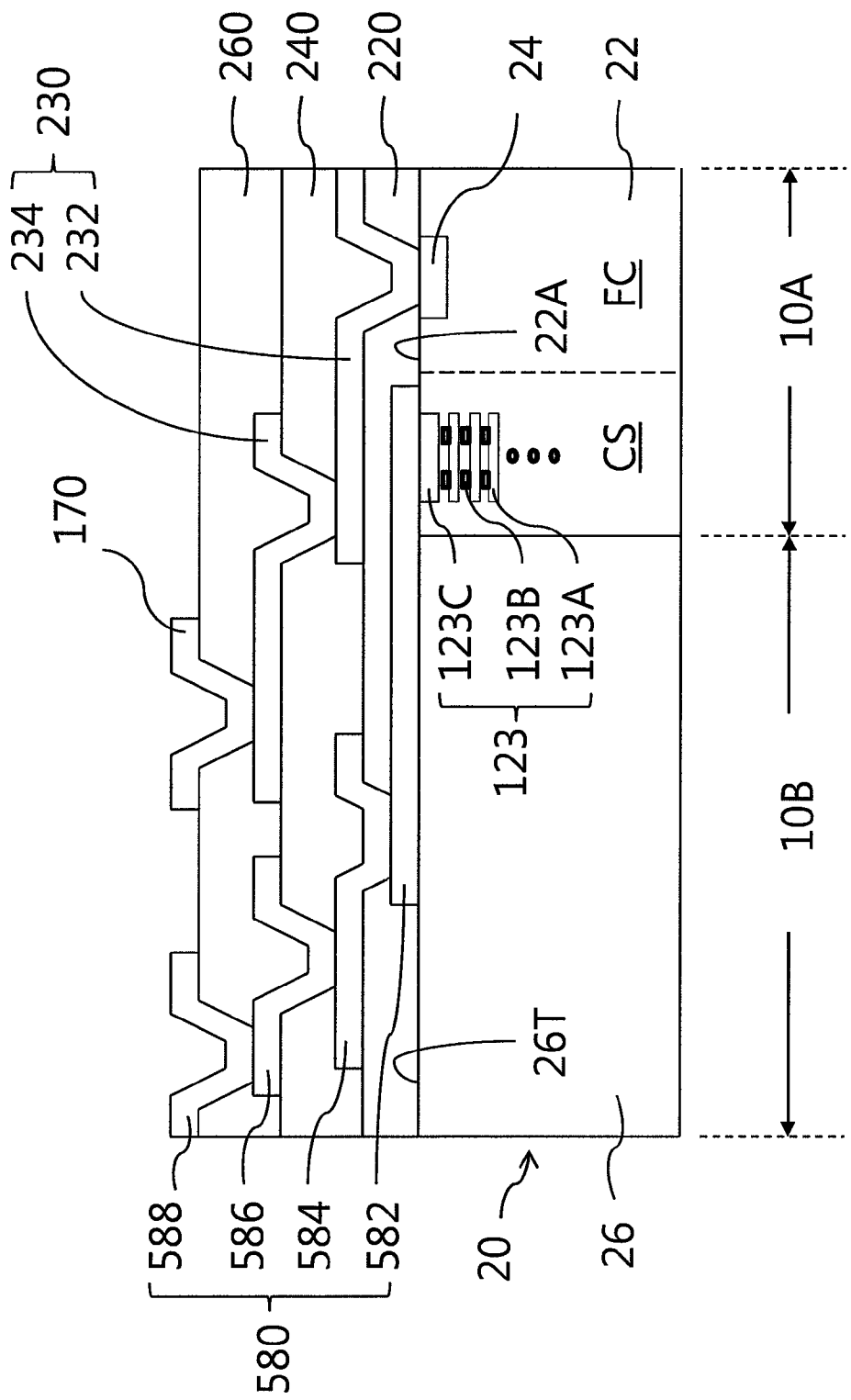

Referring to FIG. 13D, the third insulation layer 260 is formed on the resultant structure having the second PPI line 234 and the second lower seal layer 586. Then, the UBM layer 170 and the top seal layer 588 are simultaneously formed on the third insulation layer 260. The UBM layer 170 is formed to be connected to the second PPI line 234. The top seal layer 588 is formed to be connected to the second lower seal layer 586. Then, the solder ball 60 is mounted on the UBM layer 170 to form the WLCSP 500 depicted in FIG. 6.

According to the embodiments described with reference to FIGS. 9A-13D, each seal layer of the seal ring structures 180, 280, 380, 480, and 580 is formed simultaneously with the formation of at least one of the PPI layers of the re-routing laminated structures 40A-40E and the UMB line 170. There is no need to prepare a separate photomask or to add a separate process step for forming the seal ring structure 180, 280, 380, 480, or 580. The WLCSP having the seal ring structure 180, 280, 380, 480, or 580 can be manufactured by modifying an existing layout design in a cost effective manner. Therefore, each process for manufacturing the WLCSPs 100, 200, 300, 400, and 500 does not require extra cost for forming the seal ring structure 180, 280, 380, 480, and 580.

According to some embodiments, a WLCSP comprises a semiconductor device including an active surface having a contact pad, and side surfaces. A mold covers the side surfaces of the semiconductor device. A RDL structure includes a first PPI line electrically connected to the contact pad and extending on the active surface of the semiconductor device. A UBM layer is formed over and electrically connected to the first PPI line. A seal ring structure extends around the upper periphery of the semiconductor device on the mold. The seal ring structure includes a seal layer extending on the same level as at least one of the first PPI line and the UBM layer.

According to some embodiments, a WLCSP comprises a molded semiconductor device including a die having a contact pad, a re-routing laminated structure formed on the molded semiconductor device, and having a redistribution layer (RDL) structure being electrically connected to the contact pad, and a seal ring structure formed within and on the re-routing laminated structure, and extending around the upper periphery of the die.

According to some embodiments, a method of manufacturing a WLCSP comprises forming a molded semiconductor device including a semiconductor device and a mold covering side surfaces of the semiconductor device. The semiconductor device includes an active surface having a contact pad. A re-routing laminated structure is formed by simultaneously forming an interconnection line and a seal layer on the molded semiconductor devices. The interconnection line is electrically connected to the contact pad. The seal layer is spaced apart from the interconnection line and extending on the mold.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A package, comprising:
a semiconductor device including an active surface having a contact pad, and side surfaces;
a mold covering the side surfaces of the semiconductor device;
a redistribution layer (RDL) structure including a first post-passivation interconnection (PPI) line electrically connected to the contact pad and extending on the active surface of the semiconductor device;
an under-bump metallurgy (UBM) layer over and electrically connected to the first PPI line; and
a seal ring structure extending around and outside the upper periphery of the semiconductor device on the mold, the seal ring structure including a seal layer extending on the same level as at least one of the first PPI line and the UBM layer.

2. The package of claim 1, wherein the seal ring structure includes a top seal layer extending on the same level as and spaced apart from the UBM layer.

3. The package of claim 2, wherein the top seal layer and the UBM layer comprise the same material.

4. The package of claim 2, wherein the seal ring structure further includes a lower seal layer connected to the top seal layer, and extended on the same level as the first PPI line.

5. The package of claim 4, wherein the lower seal layer and the first PPI line comprise the same material.

6. The package of claim 4, wherein the lower seal layer extends on the mold and on the active surface of the semiconductor device.

7. The package of claim 4, wherein the semiconductor device further includes a chip seal ring having a seal contact pad, and
wherein the lower seal layer is in contact with the seal contact pad.

8. The package of claim 2,
wherein the RDL structure further includes a second PPI line electrically connected to the first PPI line and to the UBM layer, and
wherein the seal ring structure further includes:
a first lower seal layer extended on the same level as the first PPI line; and
a second lower seal layer connected to the first lower seal layer and the top seal layer, and extended on the same level as the second PPI line.

9. The package of claim 8, wherein the seal ring structure further includes a bottom seal layer connected to the first lower seal layer and being in contact with the mold.

10. The package of claim 9, wherein the semiconductor device further includes a chip seal ring having a seal contact pad, and
wherein the bottom seal layer is in contact with the seal contact pad.

11. The package of claim 1, further comprising a solder ball on and electrically connected to the UBM layer.

12. The package of claim 11, wherein the seal ring structure extends directly on the mold.

13. A package, comprising:
a molded semiconductor device including a die having a contact pad;
a re-routing laminated structure formed on the molded semiconductor device, and having a redistribution layer (RDL) structure being electrically connected to the contact pad; and
a seal ring structure formed within and on the re-routing laminated structure, and extending around and outside the upper periphery of the die.

14. The package of claim 13, wherein
the semiconductor device includes a circuit area and a chip seal ring surrounding the circuit area, and
the seal ring structure extends directly on the mold and surrounds the chip seal ring.

15. A method of manufacturing a wafer level chip scale package (WLCSP), comprising:
forming a molded semiconductor device including a semiconductor device and a mold covering side surfaces of the semiconductor device, the semiconductor device including an active surface having a contact pad; and
forming a re-routing laminated structure by simultaneously forming an interconnection line and a seal layer on the molded semiconductor device, the interconnection line being electrically connected to the contact pad, the seal layer being spaced apart from the interconnection line and extending on the mold, the seal layer extending outside an upper periphery of the semiconductor device.

16. The method of claim 15, wherein the forming of the re-routing laminated structure comprises:
forming the seal layer extending around and outside the upper periphery of the semiconductor device on the mold.

17. The method of claim 15, wherein the forming of the re-routing laminated structure comprises:
forming a first insulation layer having a first via opening and a second via opening on the molded semiconductor device; and
simultaneously forming the interconnection line and the seal layer, the interconnection line extending on the first insulation layer and within the first via opening, the seal layer extending on the first insulation layer and within the second via opening.

18. The method of claim 17, wherein the forming of the first insulation layer comprises:
simultaneously forming the first via opening and the second via opening in the first insulation layer, the first via opening exposing the contact pad, the second via opening exposing the mold.

19. The method of claim 17,
wherein the semiconductor device includes a chip seal ring having a seal contact pad,
wherein the forming of the first insulation layer comprises:
simultaneously forming the first via opening and the second via opening, the first via opening exposing the contact pad, the second via opening exposing the seal contact pad, and
wherein the simultaneously forming of the interconnection line and the seal layer comprises forming the seal layer being in contact with the seal contact pad.

20. The method of claim 17, before the forming of the first insulation layer, further comprising:
forming a bottom seal layer being in contact with the mold and with the active surface of the semiconductor device.

21. The method of claim 15, wherein the forming of the re-routing laminated structure comprises:
forming a first insulation layer on the molded semiconductor device;
simultaneously forming a first post-passivation interconnection (PPI) line and a first lower seal layer on the first insulation layer, the first PPI line being electrically connected to the contact pad, the first lower seal layer being spaced apart from the first PPI line and extending on the mold;
forming a second insulation layer on the first PPI line and the first lower seal layer; and
simultaneously forming a second PPI line and a second lower seal layer on the second insulation layer, the second PPI line being electrically connected to the first PPI line, the second lower seal layer being spaced apart from the second PPI line and being connected to the first lower seal layer.

22. The method of claim 15, further comprising:
simultaneously forming an under-bump metallurgy (UBM) layer and a top seal layer on the re-routing laminated structure, the UBM layer being electrically connected to the interconnection line, the top seal layer being spaced apart from the UBM layer and being connected to the seal layer.

* * * * *